US010096742B2

(12) United States Patent
Shatalov et al.

(10) Patent No.: US 10,096,742 B2
(45) Date of Patent: Oct. 9, 2018

(54) LIGHT EMITTING DEVICE SUBSTRATE WITH INCLINED SIDEWALLS

(71) Applicant: Sensor Electronic Technology, Inc., Columbia, SC (US)

(72) Inventors: Maxim S. Shatalov, Columbia, SC (US); Jianyu Deng, Lexington, SC (US); Alexander Dobrinsky, Loudonville, NY (US); Xuhong Hu, Columbia, SC (US); Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/984,246

(22) Filed: Dec. 30, 2015

(65) Prior Publication Data

US 2016/0149099 A1 May 26, 2016

Related U.S. Application Data

(63) Continuation-in-part of application No. 13/852,487, filed on Mar. 28, 2013, now Pat. No. 9,595,636.
(Continued)

(51) Int. Cl.
*H01L 33/00* (2010.01)
*H01L 33/20* (2010.01)
*H01L 33/22* (2010.01)

(52) U.S. Cl.
CPC .......... *H01L 33/0095* (2013.01); *H01L 33/20* (2013.01); *H01L 33/22* (2013.01)

(58) Field of Classification Search
None
See application file for complete search history.

(56) References Cited

U.S. PATENT DOCUMENTS 5,916,460 A    6/1999  Imoto et al.
6,177,761 B1   1/2001  Pelka et al.
(Continued)

FOREIGN PATENT DOCUMENTS

EP    2161762 A1    3/2010
JP    2005158971 A  6/2005

OTHER PUBLICATIONS

Chen, K.C. et al., "Laser Scribing of Sapphire Substrate to Increase Side Light Extraction of GaN-Based Light Emitting Diodes," Journal of Lightwave Technology, Jul. 1, 2011, 6 pages, vol. 29, No. 13.
(Continued)

*Primary Examiner* — Andres Munoz
(74) *Attorney, Agent, or Firm* — LaBatt, LLC

(57) ABSTRACT

A light emitting device having improved light extraction is provided. The light emitting device can be formed by epitaxially growing a light emitting structure on a surface of a substrate. The substrate can be scribed to form a set of angled side surfaces on the substrate. For each angled side surface in the set of angled side surfaces, a surface tangent vector to at least a portion of each angled side surface in the set of angled side surfaces forms an angle between approximately ten and approximately eighty degrees with a negative of a normal vector of the surface of the substrate. The substrate can be cleaned to clean debris from the angled side surfaces.

20 Claims, 25 Drawing Sheets

Related U.S. Application Data

(60) Provisional application No. 61/617,022, filed on Mar. 28, 2012.

(56) References Cited

U.S. PATENT DOCUMENTS

| | | | |
|---|---|---|---|
| 6,229,160 | B1 | 5/2001 | Krames et al. |
| 6,323,063 | B2 | 11/2001 | Krames et al. |
| 6,518,079 | B2* | 2/2003 | Imler ............... H01L 33/0095 257/E21.599 |
| 6,570,190 | B2 | 5/2003 | Krames et al. |
| 6,730,939 | B2* | 5/2004 | Eisert ............... H01L 33/0079 257/103 |
| 6,844,572 | B2 | 1/2005 | Sawaki et al. |
| 6,902,990 | B2 | 6/2005 | Gottfried et al. |
| 6,939,730 | B2 | 9/2005 | Goto et al. |
| 6,969,627 | B2 | 11/2005 | Pan et al. |
| 7,205,578 | B2 | 4/2007 | Eisert et al. |
| 7,268,371 | B2 | 9/2007 | Krames et al. |
| 7,358,537 | B2* | 4/2008 | Yeh ...................... H01L 33/22 257/94 |
| 7,446,344 | B2 | 11/2008 | Fehrer et al. |
| 7,579,202 | B2 | 8/2009 | Hsu et al. |
| 7,601,621 | B2 | 10/2009 | Choi et al. |
| 7,781,246 | B2 | 8/2010 | Kim et al. |
| 8,101,447 | B2 | 1/2012 | Lin et al. |
| 9,595,636 | B2 | 3/2017 | Shatalov et al. |
| 2002/0127824 | A1 | 9/2002 | Shelton et al. |
| 2003/0197191 | A1 | 10/2003 | Nitta et al. |
| 2003/0218172 | A1* | 11/2003 | Sugawara ............ H01L 33/20 257/72 |
| 2005/0093016 | A1 | 5/2005 | Yamamoto et al. |
| 2008/0128730 | A1 | 6/2008 | Fellows et al. |
| 2009/0008661 | A1* | 1/2009 | Arimitsu ............ H01L 33/20 257/96 |
| 2009/0057708 | A1 | 3/2009 | Abdul Karim et al. |
| 2009/0127578 | A1* | 5/2009 | Masuya ............... H01L 24/06 257/98 |
| 2009/0159870 | A1 | 6/2009 | Lin et al. |
| 2009/0321748 | A1 | 12/2009 | Lee |
| 2010/0019265 | A1 | 1/2010 | Sormani et al. |
| 2010/0159622 | A1 | 6/2010 | Hsieh et al. |
| 2015/0014702 | A1* | 1/2015 | Lee ...................... H01L 33/20 257/76 |

OTHER PUBLICATIONS

Holcomb, M.O. et al., "High power Truncated-Inverted-Pyramid (AlxGa1-x)[sub 0.5]In[sub 0.5]P Light-Emitting Diodes," Proceedings of SPIE, 2000, 5 pages, vol. 3938.

Horng, R. et al., "Light Extraction Study on Thin-Film GaN Light-Emitting Diodes With Electrodes Covering by Wafer Bonding and Textured Surfaces," IEEE Transactions on Electron Devices, Oct. 2010, 4 pages, vol. 57, No. 10.

Hui, K. N. et al., "Enhanced light output of angled sidewall light-emitting diodes with reflective silver films," Thin Solid Films, 2010, 4 pages, vol. 519, No. 8.

Kim, H.G., et al., "InGaN/GaN Light-Emitting Diodes with Overcut-Shaped Periodic Microstructures Formed by Wet Etching Process," Electrochemical and Solid-State Letters, May 27, 2009, 3 pages, vol. 12, No. 8.

Krames, M.R. et al., "High-power truncated-inverted-pyramid (AlxGa1-x)[sub 0.5]In[sub 0.5]P/GaP light-emitting diodes exhibiting >50% external quantum efficiency," Applied Physics Letters, 1999, 4 pages, vol. 75, No. 16.

Lee, S.J. et al., "Efficiency improvement in light-emitting diodes based on geometrically deformed chips," Part of the SPIE Conference on Light-Emitting Diodes: Research, Manufacturing and Applications III, Jan. 1999, 12 pages, vol. 3621.

Lee, T.X. et al., "Light extraction analysis of GaN-based light-emitting diodes with surface texture and/or patterned substrate," Optics Express, May 28, 2007, 7 pages vol. 15, No. 11.

Mak, G. Y. et al., "Liquid-immersion laser micromachining of GaN grown on sapphire," Applied Physics A, Dec. 22, 2010, 7 pages, vol. 102.

Murai, A. et al., "Hexagonal pyramid shaped light-emitting diodes based on ZnO and GaN direct wafer bonding," Applied Physics Letters, 2006, 4 pages, vol. 89, No. 17.

Schubert, E.F., "Light-Emitting Diodes," 2006, 50 pages, 2nd Edition, Cambridge, University, Cambridge, New York.

Schubert, E.F. et al., "Solid-State Lighting-a Benevolent Technology," Reports on Progress in Physics, 2006, 31 pages, vol. 69.

Schubert, E.F. et al., "Solid-State Light Sources Getting Smart," Science AAS, 2005, 6 pages, vol. 308.

Shakya, J. et al., "Enhanced light extraction in III-nitride ultraviolet photonic crystal light-emitting diodes," Applied Physics Letters, 2004, 4 pages, vol. 85, No. 1.

Shmatov, O. et al., "Truncated-inverted-pyramid light emitting diode geometry optimisation using ray tracing technique," IEE Proceedings—Optoelectronics, Jun. 2003, 5 pages, vol. 150, No. 3.

Streubel, K. et al., "High brightness AlGaInP light-emitting diodes," IEEE Journal of Selected Topics in Quantum Electronics, Apr. 2002, 12 pages, vol. 8, No. 2.

Sun, C.C. et al., "Enhancement of light extraction of GaN-based light-emitting diodes with a microstructure array," Optical Engineering, Aug. 2004, 2 pages, vol. 43, No. 8.

Wang, X. H. et al., "Laser micromachining of optical microstructures with inclined sidewall profile," Journal of Vacuum Science & Technology B: Microelectronics and Nanometer Structures, 2009, 6 pages, vol. 27, No. 3.

Zukauskas, A. et al., "Solid State Lighting", Introduction to Solid State Lighting, 2002, 132 pages, http://nina.ecse.rpi.edu/shur/.

Munoz, A., U.S. Appl. No. 13/852,487, Non-Final Rejection, dated Dec. 10, 2014, 25 pages.

Park, International Search Report and Written Opinion for International Application No. PCT/US2013/034288, dated Jun. 28, 2013, 12 pages.

Munoz, A., U.S. Appl. No. 13/852,487, Notice of Allowance, dated Nov. 2, 2016, 11 pages.

Munoz, A., U.S. Appl. No. 13/852,487, Final Rejection, dated Aug. 4, 2016, 20 pages.

Munoz, A., U.S. Appl. No. 13/852,487, Non-Final Rejection, dated Jan. 22, 2016, 15 pages.

* cited by examiner

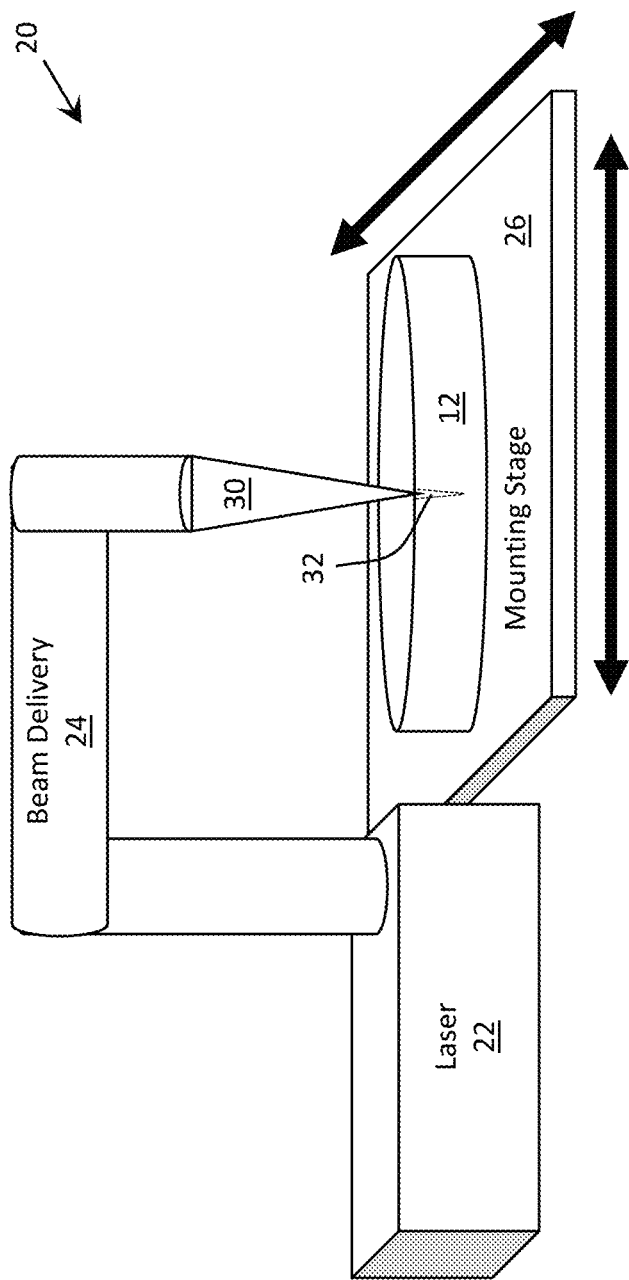

Not Scribed

30° Shallow Scribe

Vertical Deep Scribe

30° Deep Scribe

θ = 0°

θ = 15°

$\theta = 30°$ $\theta = 45°$ $\theta = 35°$ $\theta = 40°$ $\theta = 50°$ $\theta = 60°$

θ = 0°

θ = 30°

$\theta = 45°$ $\theta = 60°$

Bottom View, Isometric

Bottom View

Side View

LIGHT EMITTING DEVICE SUBSTRATE WITH INCLINED SIDEWALLS

REFERENCE TO RELATED APPLICATIONS

The present patent application is a continuation-in-part application of U.S. application Ser. No. 13/852,487, entitled "Light Emitting Device Substrate with Inclined Sidewalls," which was filed on 28 Mar. 2013, which claims the benefit of U.S. Provisional Application No. 61/617,022, entitled "Light Emitting Diode Element and Method for Fabricating the Same," which was filed on 28 Mar. 2012, each of which is hereby incorporated by reference in its entirety to provide continuity of disclosure.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to light emitting devices, and more particularly, to a solution for improving light extraction efficiency through shaping one or more elements of the device.

BACKGROUND ART

A light emitting diode (LED) is typically composed of semiconductor layers with high indexes of refraction. For example, a group III nitride based LED can have layers with refractive indexes that are typically higher than two. A typical LED emits light uniformly in different directions. However, only some of the light exits the LED structure. A large fraction of emitted light is totally internally reflected and trapped in the semiconductor structure. This light trapping leads to light absorption of the semiconductor layers and contact, which in turn leads to a low light extraction efficiency for the LED.

Many approaches propose to improve light extraction efficiency through surface roughness and the shaping of the LED device. Shaping may be a straightforward and effective approach to increasing the light extraction efficiency of an LED. One approach discusses an LED in a shape of a truncated inverted pyramid, where four faces of an AlGaInP/GaP LED chip are mechanically fabricated to form the truncated inverted pyramid. Using this shape, the external quantum efficiency of the LED was increased. Another approach uses an etching process to fabricate a substrate with inclined faces. In this approach, LED epitaxial layers are selectively grown over the etched regions to obtain a multi-incline light emitting structure without using a mechanical fabrication process.

The use of various LED shapes have been proposed. One approach uses polyhedron chips (rhomboidal and triangular) with parallel bases. For example, FIG. 1A shows a horizontal cross section of a rhomboidal-geometry chip 2 according to the prior art, along with photon trajectories. As illustrated, the chip 2 has a plane deformation angle, an #90°. The photons that travel parallel to the horizontal plane inevitably escape since each internal reflection reduces the incidence angle by an. An optimal deformation angle at which only a couple of flights are required for most photons to escape is close to $\alpha_h = 2\Theta_c(n_s, n_e)$, where $\Theta_c$ is the escape cone, $n_s$ is the refractive index of the semiconductor materials, and $n_e$ is the refractive index of the surrounding environment (e.g., air). If, in addition, the sidewalls of the chip are slanted similarly, most of the photons generated would find escape cones regardless of their traveling directions. Increased light extraction efficiency (e.g., up to 120% compared with a rectangular geometry) was shown using a statistical tracing of the photon trajectories. One proposal describes a technique for the fabrication of geometrically deformed chips by slanted sawing of wafers.

FIG. 1B shows a schematic vertical cross section of a truncated inverted pyramid LED 4 according to the prior art. The geometrically deformed LED 4 is formed from an epitaxial AlGaInP structure wafer bonded to a thick GaP substrate. By using a beveled dicing blade, chips with sidewall angles of 35° with respect to the vertical were fabricated. The geometry of the LED 4 is seen to improve light extraction by redirecting totally internally reflected photons from the sidewalls to the top surface or from the top surface to the sidewalls at small incidence angles.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the invention provide a light emitting device having improved light extraction. The light emitting device can be formed by epitaxially growing a light emitting structure on a surface of a substrate. The substrate can be scribed to form a set of angled side surfaces on the substrate. For each angled side surface in the set of angled side surfaces, a surface tangent vector to at least a portion of each angled side surface in the set of angled side surfaces forms an angle between approximately ten and approximately eighty degrees with a negative of a normal vector of the surface of the substrate. The substrate can be cleaned to clean debris from the angled side surfaces.

A first aspect of the invention provides a light emitting device comprising: a light emitting structure; and a substrate formed with the light emitting structure, the substrate having a first surface with the light emitting structure formed thereon and a second surface parallel with the first surface, the second surface having a length that is less than a length of the first surface, the first surface extending horizontally underneath the light emitting structure beyond any borders of the light emitting structure with the substrate, a pair of opposing vertical side surfaces each extending vertically from an opposing end of the first surface, each of the opposing vertical side surfaces being perpendicular to one of the opposing ends of the first surface, and a pair of opposing oblique sides each extending obliquely inward from one of the vertical side surfaces, each opposing oblique side extending obliquely inward to an opposing end of the second surface.

A second aspect of the invention provides a method of fabricating a device, comprising: forming a light emitting structure on a substrate; and scribing the substrate with a plurality of surfaces, the scribing including forming a first surface that is coupled to the light emitting structure, a second surface parallel with the first surface, the second surface having a length that is less than a length of the first surface, the first surface extending horizontally underneath the light emitting structure beyond any borders of the light emitting structure with the substrate, a pair of opposing vertical side surfaces each extending vertically from an opposing end of the first surface, each of the opposing vertical side surfaces being perpendicular to one of the opposing ends of the first surface, and a pair of opposing oblique sides each extending obliquely inward from one of the vertical side surfaces, each opposing oblique side extending obliquely inward to an opposing end of the second surface.

A third aspect of the invention provides a method, comprising: epitaxially growing a light emitting structure on a surface of a substrate; scribing a bottom part of the substrate with a set of angled side surfaces, wherein a surface tangent vector to at least a portion of each angled side surface forms an angle between approximately −10 degrees and approximately −30 degrees with a negative of a normal vector of the surface of the substrate, wherein a negative degree indicates that a surface area of the bottom part of the substrate is smaller than a surface area of a top part of the substrate, and wherein at least 10 μm to about 200 μm of the substrate adjacent the light emitting structure remains unscribed; and cleaning the substrate and the light emitting structure after the scribing.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 3A and 3B show illustrative configurations of a laser micromachining system according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a light emitting device having improved light extraction. The light emitting device can be formed by epitaxially growing a light emitting structure on a surface of a substrate. The substrate can be scribed to form a set of angled side surfaces on the substrate. For each angled side surface in the set of angled side surfaces, a surface tangent vector to at least a portion of each angled side surface in the set of angled side surfaces forms an angle between approximately ten and approximately eighty degrees with a negative of a normal vector of the surface of the substrate. The substrate can be cleaned to clean debris from the angled side surfaces. The inclined sidewalls can mitigate total internal reflection (TIR), and therefore, lead to an increase in an overall light extraction efficiency for the device. As used herein, unless otherwise noted, the term "set" means one or more (i.e., at least one) and the phrase "any solution" means any now known or later developed solution.

Initially, a substrate including a set of light emitting structures located on a surface of the substrate is obtained. The substrate can comprise any type of suitable substrate, such as sapphire. However, other types of substrate can be used including, for example, aluminum nitride (AlN), gallium nitride (GaN), AlGaN, zinc oxide (ZnO), lithium gallate (LiGaO$_2$), lithium aluminate (LiAlO$_2$), ScMgAlO$_4$, spinel (MgAl$_2$O$_4$), silicon carbide (SiC), silicon (Si), and/or the like.

Figure 1A:
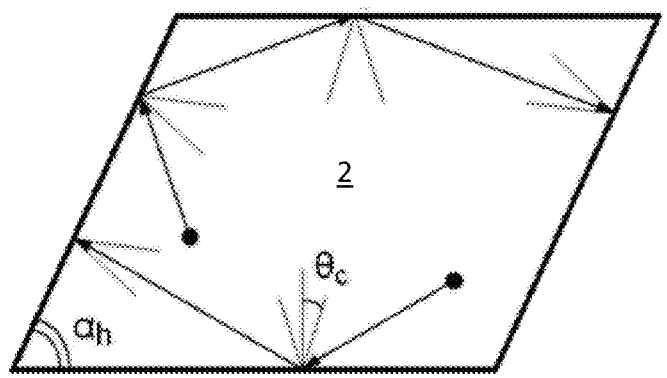
FIGS. 1A and 1B show illustrative device geometries according to the prior art.
Figure 1B:
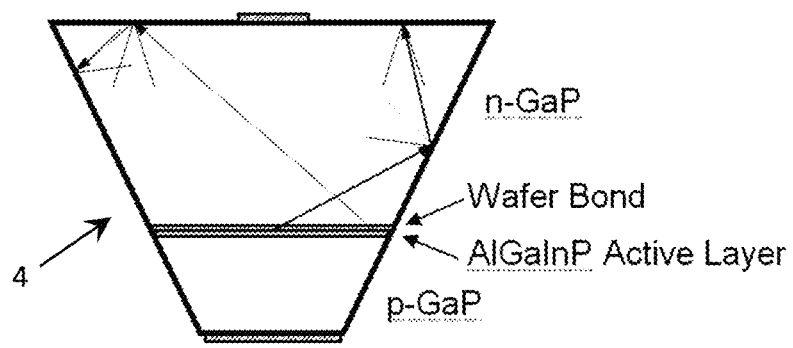
Figure 2:
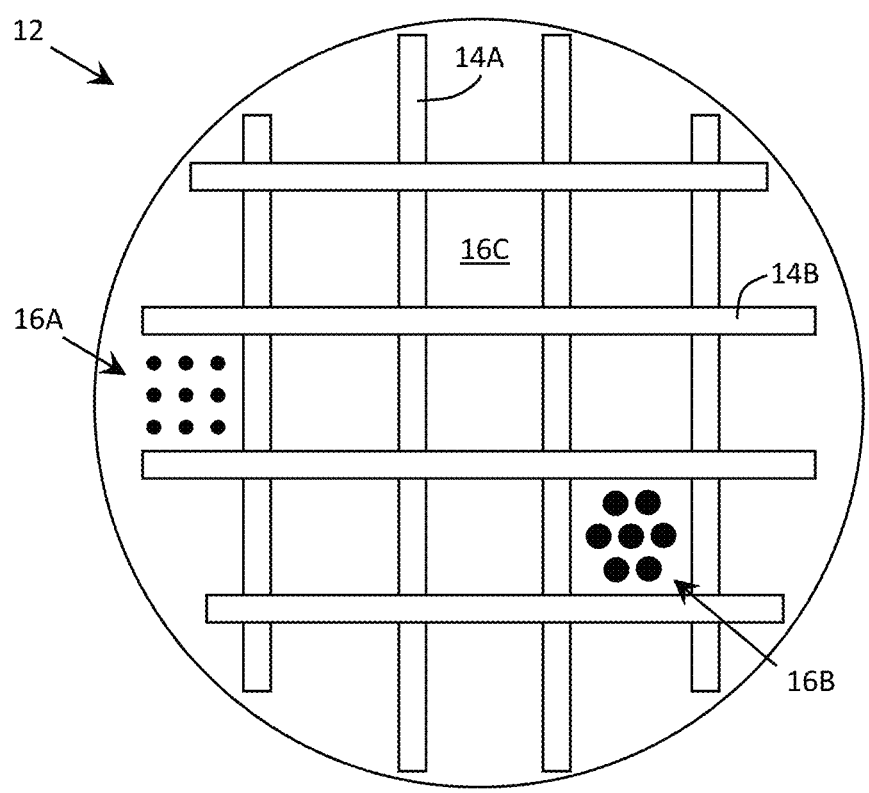
FIG. 2 shows a two dimensional top view of an illustrative substrate according to an embodiment.

Multiple light emitting structures (e.g., dies) can be grown on a single substrate. To this extent, FIG. 2 shows a two dimensional top view of a surface of an illustrative substrate 12 according to an embodiment. In this case, the surface of the substrate 12 includes a plurality of stripes, such as stripes 14A and 14B, of a masking agent (e.g., isolating material) of any type. The masking agent can be placed in any locations on the surface of the substrate 12 where semiconductor film growth is not desired. In an embodiment, the masking agent comprises silicon dioxide. As illustrated, the stripes 14A, 14B can form a plurality of regions, such as regions 16A-16C, in a grid arrangement.

In an embodiment, the surface of one or more of the regions 16A-16C of the substrate 12 can be patterned or roughened using any solution. For example, a patterned surface can be formed using lithography and/or etching. In an embodiment, the patterned surface is formed using photolithography and wet chemical etching. However, it is understood that other types of lithography, such as e-beam, stepper, and/or the like, and/or other types of etching, such as dry etching, can be used. The patterning or roughening can be configured to: provide for relaxation of stress buildup between the substrate 12 and an adjacent layer, such as a buffer layer; yield a semiconductor layer in a light emitting structure having a lower density of dislocations; and/or the like. As illustrated, the patterning/roughening can be different for different regions, such as regions 16A and 16B.

In an embodiment, the set of light emitting structures can be epitaxially grown on the surface of the substrate (e.g., within the regions 16A-16B) using any solution. Illustrative epitaxial growth processes include metalorganic chemical vapor deposition (MOCVD), migration enhanced MOCVD, molecular beam epitaxy (MBE), and/or the like. Each light emitting structure can be formed of any type of light emitting heterostructure. Furthermore, the light emitting structure can include various components to operate the light emitting structure. For example, the light emitting structure can include p-type and n-type doped semiconductor layers, which include a light generating structure formed of a set of quantum wells and barriers (e.g., which can be formed by hetero-epitaxy of semiconductor layers). Additionally, the light emitting structure can include an n-type contact and a p-type contact located adjacent to opposing sides of the light generating structure, thereby forming a light emitting diode.

In an embodiment, the light emitting structure is a group III-V materials based device, in which some or all of the various layers are formed of elements selected from the group III-V materials system. In a more particular illustrative embodiment, the various layers of the light emitting structure are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \le W, X, Y, Z \le 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

In an embodiment, a light emitting structure is configured to operate as a light emitting diode (LED), such as a conventional or super luminescent LED. Alternatively, the light emitting structure can be configured to operate as a laser diode (LD). In either case, during operation of the light emitting structure, application of a bias comparable to the band gap results in the emission of electromagnetic radiation from an active region of the light emitting structure. The electromagnetic radiation emitted by the light emitting structure can comprise a peak wavelength within any range of wavelengths, including visible light, ultraviolet radiation, deep ultraviolet radiation, infrared light, and/or the like.

Figure 3B:
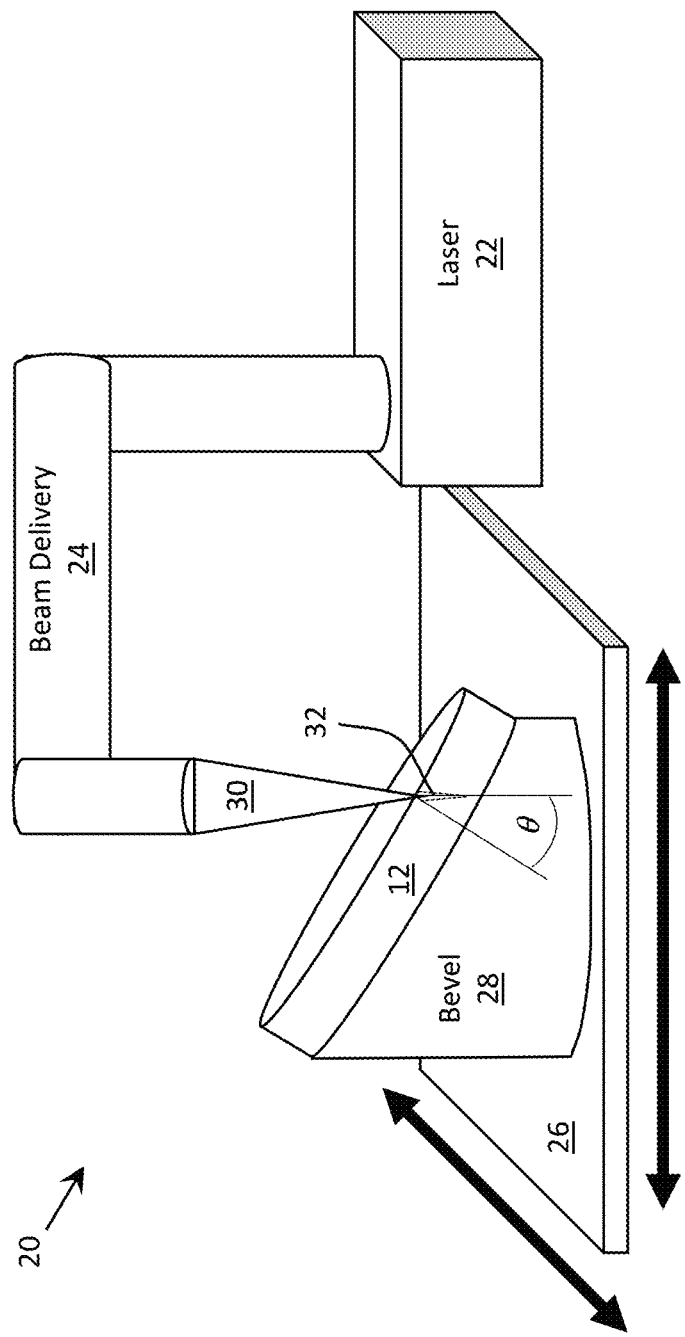

Regardless, after formation of a set of light emitting structures on the substrate 12, a light emitting structure and/or the corresponding substrate 12 can be shaped to improve light extraction from the structure. In an embodiment, the set of light emitting structures and/or the substrate 12 are shaped using a laser micromachining system. To this extent, FIGS. 3A and 3B show illustrative configurations of a laser micromachining system 20 according to embodiments. The laser micromachining system 20 includes a laser 22, a beam delivery component 24, and a mounting stage 26. During operation, the laser 22 generates a laser beam 30, which is directed toward the mounting stage 26 by the beam delivery component 24. The mounting stage 26 can be configured to move in each of four horizontal directions to adjust a location of the mounting stage 26 relative to the laser beam 30 location. In an embodiment, the laser 22 operates at an ultraviolet wavelength and delivers approximately 35 mJ/pulse at an approximately 300 Hertz repetition rate. While the system 20 is shown including a single laser beam 30, it is understood that any number of one or more lasers 22 and/or laser beams 30 can be utilized to scribe the substrate 12. Similarly, while the system 20 is shown having a laser beam 30 that is in a fixed location, it is understood that the system 20 can be implemented with a laser beam 30 that can be moved.

The substrate 12 can be located on the mounting stage 26 and moved with respect to the laser beam 30 by moving the mounting stage 26. To this extent, the substrate 12 can be moved so that the laser beam 30 scribes a set of grooves 32 into the substrate 12. For example, the mounting stage 26 can be moved to cause the laser beam 30 to make vertical and horizontal passes along the grid formed by the stripes 14A, 14B (FIG. 2) of the masking agent to result in straight vertical and horizontal grooves 32 in the substrate 12.

As shown in FIG. 3A, the mounting stage 26 and substrate 12 can be configured so that the grooves 32 formed within the substrate 12 have a substantially vertical orientation. In an embodiment, the system 20 is configured to form grooves 32 within the substrate 12 having any of a plurality of angles. To this extent, as shown in FIG. 3B, the substrate 12 can be mounted on a bevel 28 located on the mounting stage 26. The bevel 28 can have an angled top surface that corresponds to a desired non-vertical angle Θ to be formed in the substrate 12. In this configuration, the mounting stage 26 can be moved with respect to the location of the laser beam 30 to form the grooves 32 of the desired angle. In order to adjust the angle Θ, a different bevel 28 can be used.

In an embodiment, an angled groove 32 is formed by first forming substantially vertical grooves 32 (e.g., as shown in FIG. 3A) having a kerf sufficiently wide to enable the laser beam 30 to pass unobstructed to form the angled groove. Subsequently, the substrate 12 can be angled with respect to the laser beam 30 (e.g., as shown in FIG. 3B), and the angled sides of the grooves 32 can be formed. However, it is understood that this is only illustrative of various solutions for forming grooves 32 having angled sides. For example, in alternative embodiments, one or more of the mounting stage 26, bevel 28, and/or beam delivery component 24 can be configured to be movable in a direction that adjusts an angle of the laser beam 30 with respect to a surface of the substrate 12 to form a groove 32 in the substrate 12 having sides of a desired angle Θ.

After the grooves 32 having sides of the desired angle(s) Θ are formed, the grooves 32 can be cleaned from light absorbing residue using any solution. Illustrative cleaning solutions include, for example: a dry reactive ion etching (RIE), wet etching in a potassium hydroxide (KOH) solution, a phosphoric sulfuric acid, and/or the like, etc. Furthermore, the grooves 32 can be cleaned using a combination of two or more cleaning solutions. In an embodiment, prior to cleaning the grooves 32, one or more surfaces of the substrate 12 and/or light generating structure(s) included thereon, can be protected from etching, e.g., by applying a thin silicon dioxide mask layer over the surface(s).

When a dry RIE etching procedure is utilized to etch the ablated surfaces, an etching area can be opened, e.g., with photolithography, after the surfaces have been laser scribed. A dry RIE etching using, for example, a $BCl_3/Ck_2/Ar$ chemistry, can be applied to etch the scribed surface(s). When using a KOH wet etching procedure, after the laser scribing, the substrate 12 can be soaked in a diluted KOH solution at room temperature in order to clean the scribed surface(s). The KOH can clean deep laser debris and will not attack the semiconductor layer material located on the substrate 12 at room temperature. Phosphoric sulfuric acid can etch semiconductor layers more than twenty times faster than a substrate material such as sapphire at an elevated temperature. Using a phosphoric sulfuric acid wet etching procedure, a thin layer of silicon dioxide can be deposited on the substrate 12, e.g., using plasma-enhanced chemical vapor deposition (PECVD). A silicon dioxide etching window can be opened using photolithography or the like. The silicon dioxide in the open window can be etched with, for example, a buffered oxide etcher, RIE dry etching, or the like. Subsequently, the substrate 12 can be soaked in phosphoric sulfuric acid at an elevated temperature to clean the scribed surface(s). Experimental results indicate that the use of any of the cleaning procedures described herein can result in similar output power improvement for the light emitting structure.

Figure 4A:
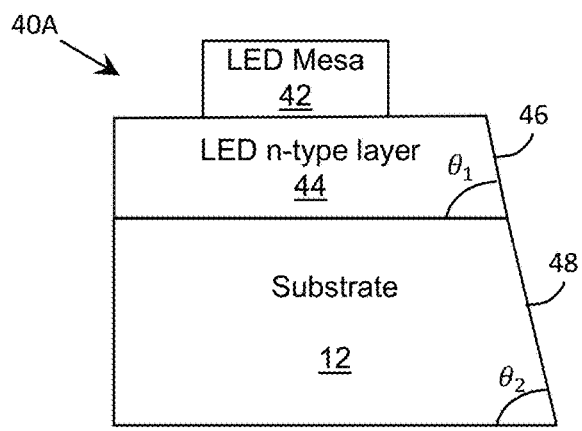
FIGS. 4A-4C show schematics of illustrative light emitting diode (LED) dies having angled side surfaces according to embodiments.
Figure 4B:
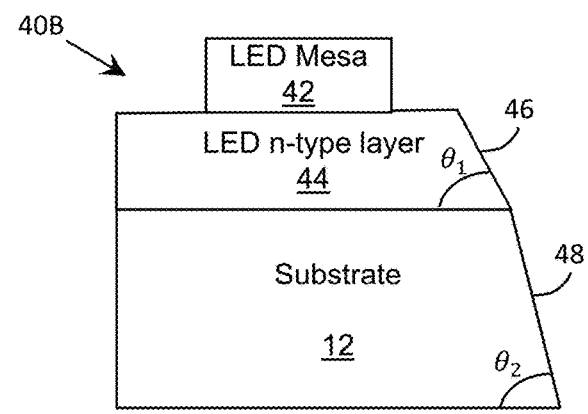
Figure 4C:
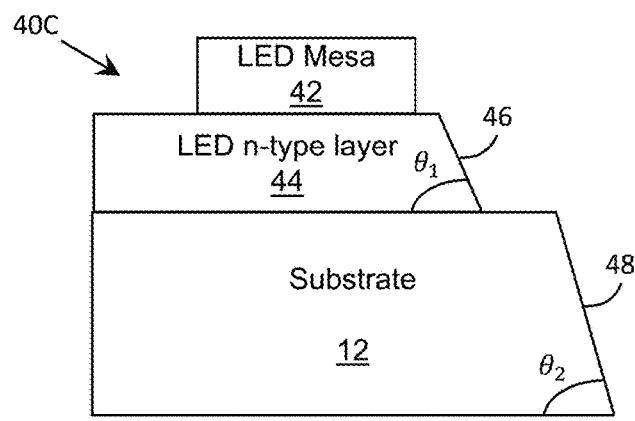

As described herein, the substrate 12 is scribed to form a set of angled side surfaces on the substrate 12, which can be subsequently cleaned to achieve a shape that improves light extraction from the substrate 12. Similarly, one or more of the side surfaces of the light generating structure can be angled to improve light extraction from the light generating structure. To this extent, FIGS. 4A-4C show schematics of illustrative light emitting diode dies 40A-40C having angled side surfaces according to embodiments. In each case, the light emitting diode 40A-40C includes a diode having a mesa structure, which includes an LED mesa 42 and an LED n-type layer 44, which is located on the substrate 12. The LED n-type layer 44 and LED mesa 42 can be formed using any solution, e.g., epitaxially grown on the substrate 12.

As illustrated, the LED n-type layer 44 can have an angled side surface 46 and the substrate 12 can have an angled side surface 48. Similar to the angled side surface 48 of the substrate 12, the angled side surface 46 can be formed using etching, laser scribing, and/or the like. The side surfaces 46, 48 can form inclination angles $\Theta_1$, $\Theta_2$, respectively, with a bottom surface of the respective layers. The side surfaces 46, 48 and inclination angles $\Theta_1$, $\Theta_2$ can have any of various types of relationships. For example, in FIG. 4A, the side surfaces 46, 48 can be substantially aligned, with the inclination angles $\Theta_1$, $\Theta_2$ being substantially equal. In FIG. 4B, the side surface 46 starts at the top edge of the side surface 48, but the inclination angles $\Theta_1$, $\Theta_2$ are different. In FIG. 4C, LED n-type layer 44 does not extend all the way to the end of the substrate 12, and the side surface 46 starts from a top surface of the substrate 12. In this case, the inclination angles $\Theta_1$, $\Theta_2$ can be the same or different.

While each of the light emitting diode dies 40A-40C is shown having a single angled side for the n-type layer 44 and the substrate 12 for clarity, it is understood that each light emitting diode die 40A-40C can have any number of angled sides. Furthermore, while the angled sides 46, 48 are shown on the same side of the light emitting diode dies 40A-40C, it is understood that a side of each light emitting diode die 40A-40C could include only one of the sides, which is angled. Additionally, while the inclination angles $\Theta_1$, $\Theta_2$ are both shown as being less than ninety degrees, it is understood that either inclination angle $\Theta_1$, $\Theta_2$ can be greater than ninety degrees.

As described herein, an angled side can have any angle less than or greater than the normal vector of a top surface of the corresponding layer (e.g., the substrate 12, the n-type layer 44, and/or the like). In an embodiment, a surface tangent vector to the angled side forms an angle between approximately ten and approximately eighty degrees with a negative of a normal vector of a top surface of the corresponding layer. In a more specific embodiment, the angle is approximately thirty degrees. In an embodiment, the substrate sides can be angled to form a truncated inverted pyramid.

Figure 5A:
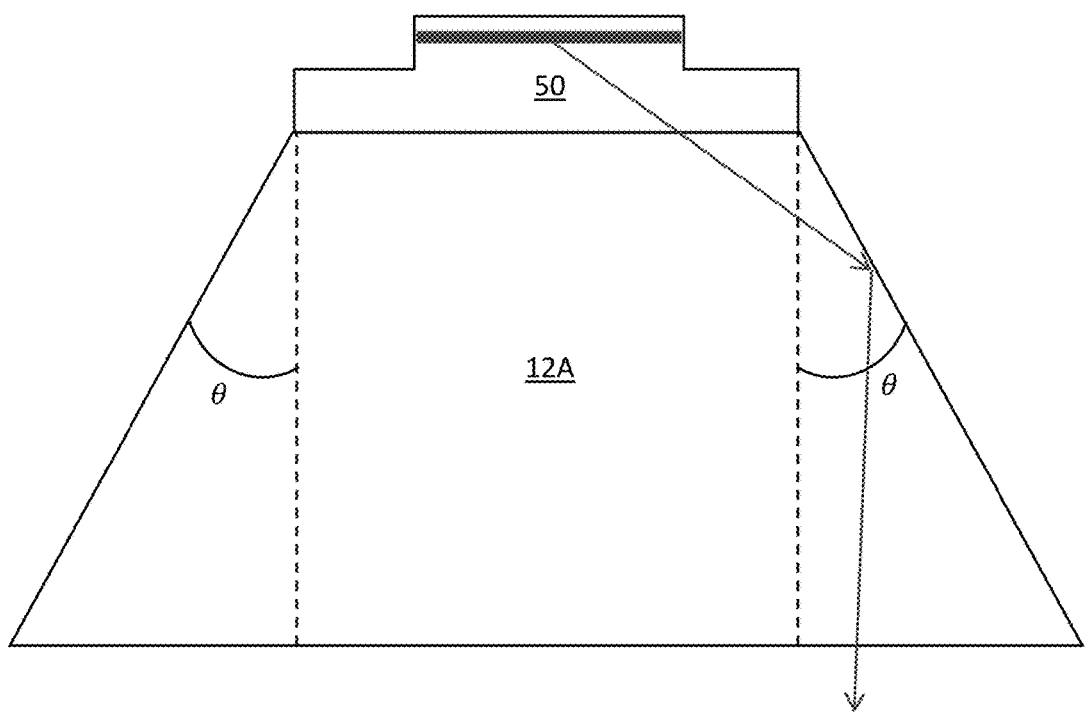
FIGS. 5A-5G show illustrative substrate configurations according to embodiments.

FIGS. 5A-5G show illustrative substrate configurations according to embodiments, along with illustrative photon trajectories. In FIG. 5A, the substrate 12A has angled sides, which form an angle $\Theta$ with a negative of the normal of a surface of the substrate 12A on which the light emitting structure 50 is located. In this case, the angled sides are substantially linear and cause the substrate 12A to have a cross section area that increases with distance from the light generating structure 50. However, it is understood that this is only illustrative, and a cross section area of the substrate 12A can decrease with distance from the light generating structure 50.

Figure 5B:
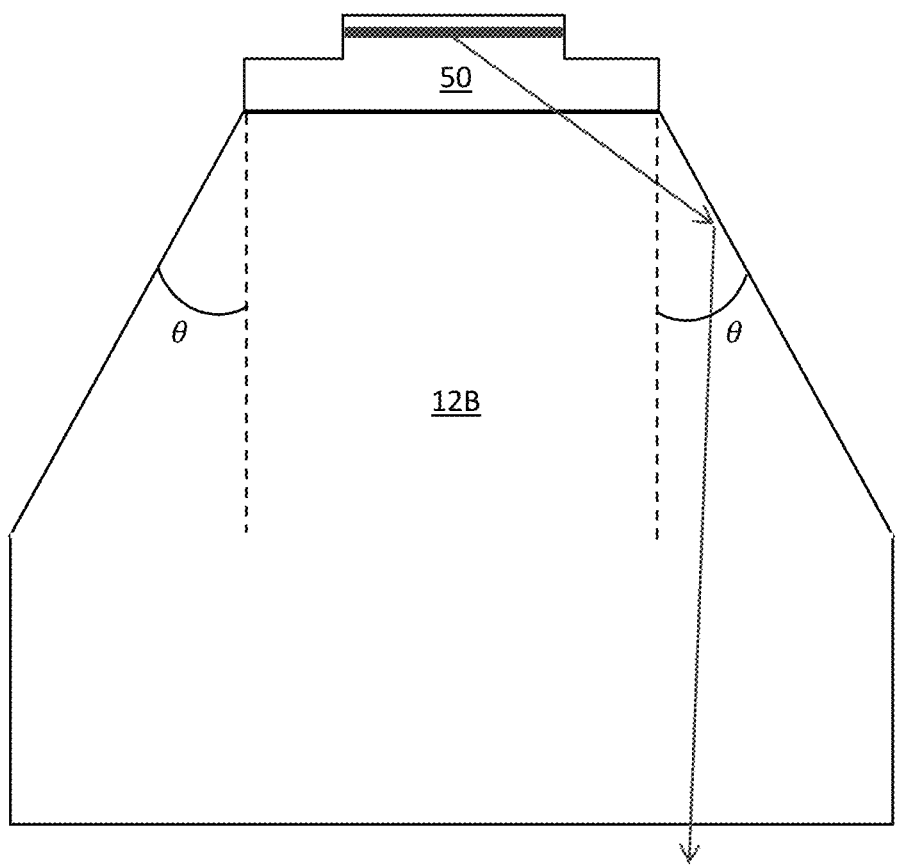

In an embodiment, the scribing angle of a side of the substrate can be varied as a function of depth (e.g., distance from the surface on which the light generating structure 50 is located). For example, FIG. 5B shows an illustrative substrate 12B having sides that, for an upper portion of the substrate 12B, form an angle $\Theta$ with the negative of the normal of the top surface of the substrate 12B on which the light emitting structure 50 is located. However, a lower portion of the substrate 12B is substantially perpendicular to the top surface of the substrate 12B.

Figure 5C:
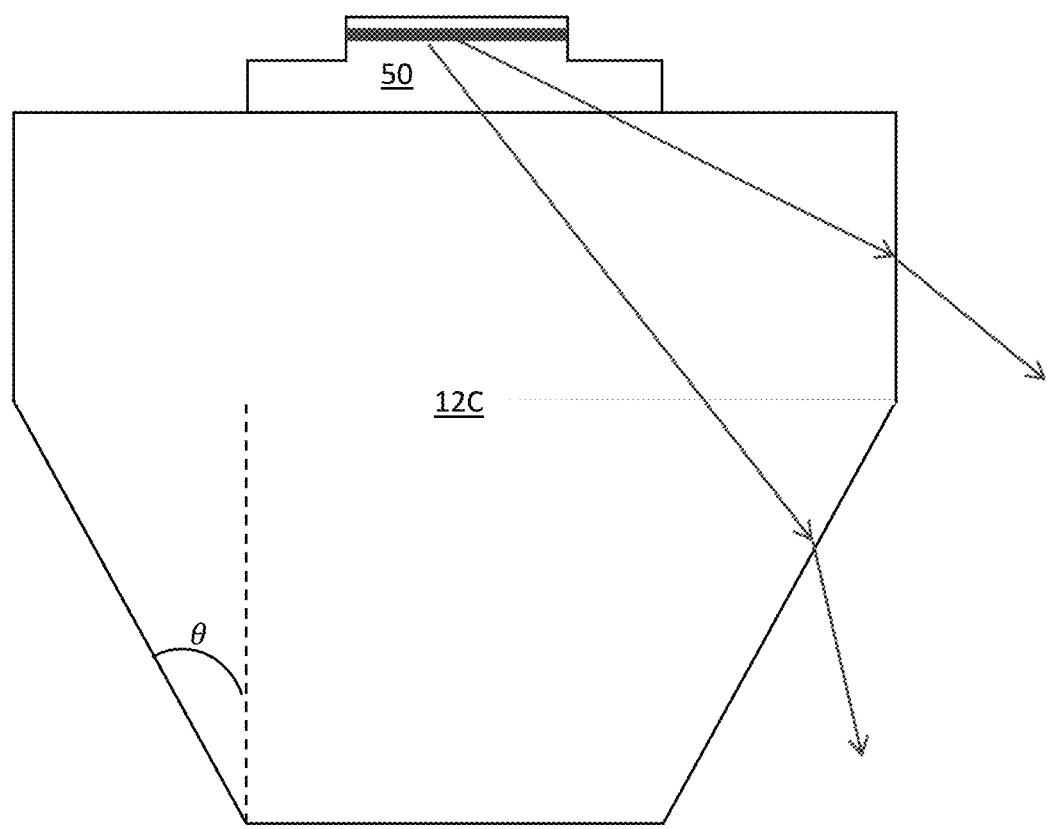
Figure 5D:
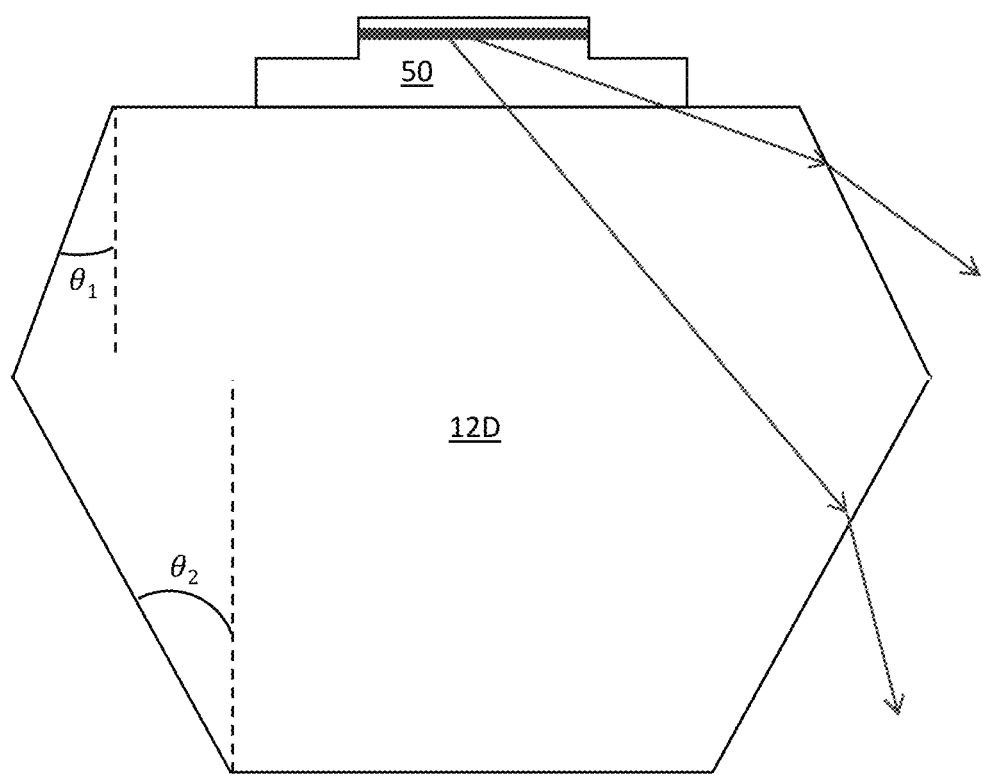

Similarly, FIG. 5C shows an illustrative substrate 12C having sides in which the upper portion is substantially perpendicular to the top surface of the substrate 12C on which the light emitting structure 50 is located. However, a lower portion of the sides of the substrate 12C form an angle $\Theta$ with the negative of the normal of the top surface of the substrate 12C. FIG. 5D shows an illustrative substrate 12D having sides that, for an upper portion of the substrate 12D, form an angle $\Theta_1$ with a negative of the normal of the top surface of the substrate 12D on which the light emitting structure 50 is located, and for a lower portion of the substrate 12D, form an angle $\Theta_2$ with the negative of the normal of the top surface of the substrate 12D. In this case, the angles $\Theta_1$ and $\Theta_2$ have opposite signs.

Figure 5E:
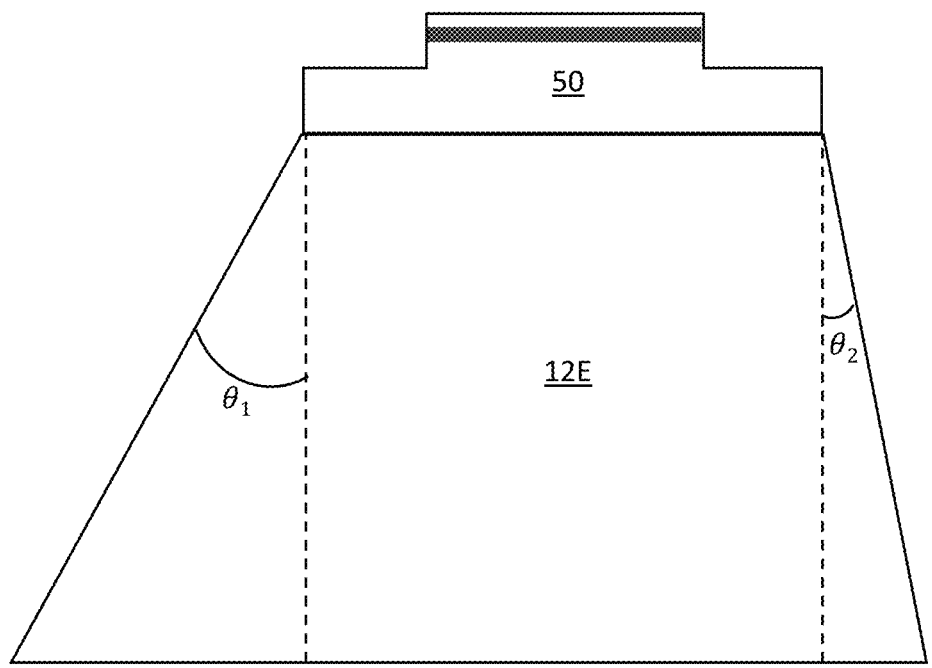

In an embodiment, the substrate can include sides that form different angles with a negative of the normal of the top surface of the substrate on which the light emitting structure 50 is located. To this extent, FIG. 5E shows an illustrative substrate 12E having a first side forming an angle $\Theta_1$ with the negative of the normal of the top surface of the substrate 12E and a second side forming an angle $\Theta_2$ with the negative of the normal of the top surface of the substrate 12E. As illustrated, the angles $\Theta_1$ and $\Theta_2$ are different. In an embodiment, the angles $\Theta_1$ and $\Theta_2$ are selected to control a light intensity distribution pattern for the device.

Figure 5F:
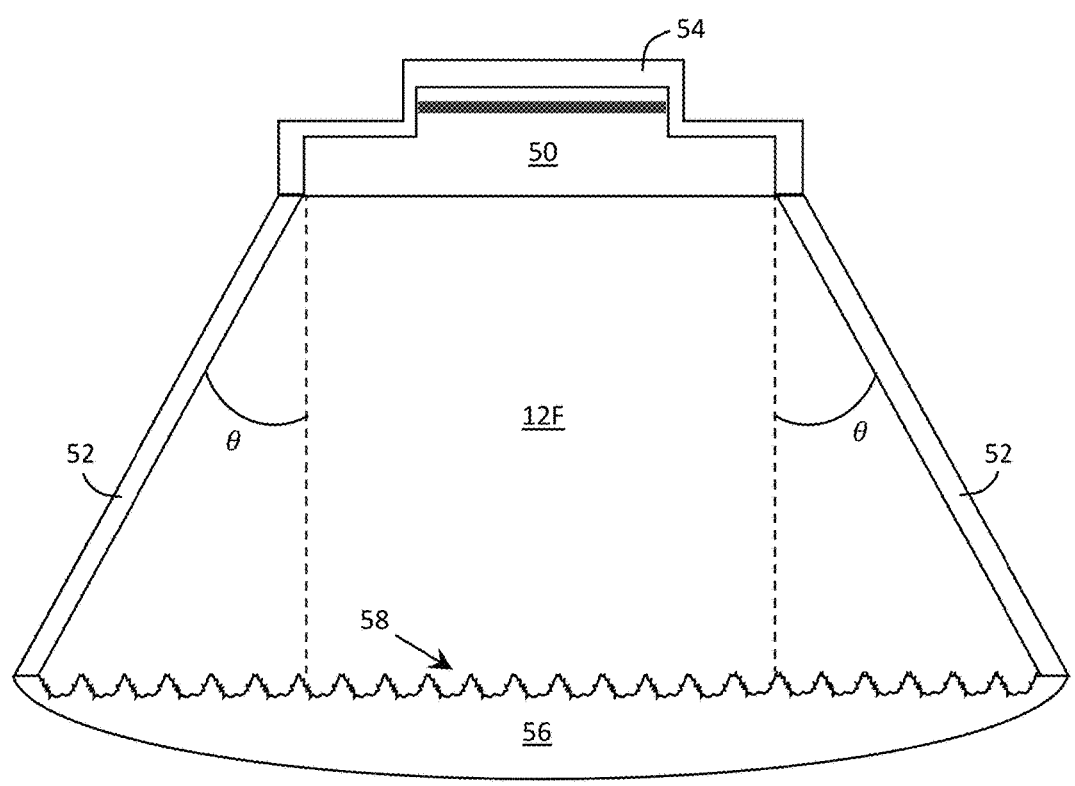

A device described herein can undergo additional processing, which can adjust one or more aspects of the emission of light from the device. To this extent, FIG. 5F shows an illustrative substrate 12F wherein the angled side surfaces are covered with a material 52. In an embodiment, the material 52 comprises a reflective coating. In an embodiment, the reflective coating is an ultraviolet reflective coating and contains aluminum, rhodium, or both. In another embodiment, the reflective coating is approximately ninety percent reflective of the light emitted by the light emitting structure. Inclusion of such a reflective coating can increase the focusing power of the LED device. While two angled side surfaces are shown completely covered with the reflective coating, it is understood that embodiments can include any number of one or more angled side surfaces completely or only partially covered with the reflective coating. Similarly, it is understood that some or all of the light emitting structure 50 can be covered with a material 54, which also can comprise a reflective coating in an embodiment.

In an embodiment, one or more surfaces of the substrate 12F and/or the light emitting structure 50 is covered with a material having a refraction index at a peak wavelength of light emitted by the light emitting structure 50, which is between the corresponding refraction indices of the substrate 12F and the surrounding environment (e.g., air). In this case, one or more of the materials 52, 54, and 56 can comprise such a refraction index. In a more specific embodiment, both the substrate 12F and the light emitting structure 50 are encapsulated by the material. In a still more specific embodiment, the material is a composite material including a matrix material and a filler material. In this case, illustrative bonding materials for the matrix material include a sol-gel, silicone, an amorphous fluoropolymer, an epoxy, and/or the like, and illustrative materials for the filler materials include nanoparticles and/or microparticles formed of alumina sol-gel glass, alumina aerogel, sapphire, aluminum nitride (e.g., single crystal aluminum nitride), boron nitride (e.g., single crystal boron nitride), fused silica, and/or the like. In a further embodiment, one or more sides of the material, such as the material 56 covering a bottom of the substrate 12F, can be shaped to form a lens controlling an angular light emission pattern for the device. Furthermore, one or more of the materials 52, 56 can comprise a material, such as a phosphor (e.g., such as those used in white light emitting diodes), which fluoresces at a wavelength longer than the peak wavelength of the light emitted by the light emitting structure 50.

In an embodiment, one or more surfaces of the substrate 12F can be further configured based on a set of desired device characteristics. For example, a bottom surface 58 of the substrate 12F is shown having been roughened. The roughening can be configured to improve an extraction of light from the substrate 12F, e.g., by further mitigating the TIR, and/or the like. In an embodiment, the roughening forms a photonic crystal. In another embodiment, the roughening has two scales, where one scale is larger than the peak emission wavelength of the light emitted by the light emitting structure 50 (e.g., by approximately an order of magnitude) and a second scale is on the order of the peak emission wavelength. While the device is shown having a roughened bottom surface 58, it is understood that any combination of one or more surfaces of the substrate 12F can be roughened, including one or more of the angled side surfaces. In another embodiment, one or more wave guiding structures, such as optical fibers, can be attached to a surface of the substrate 12F, such as the bottom surface 58.

Figure 5G:
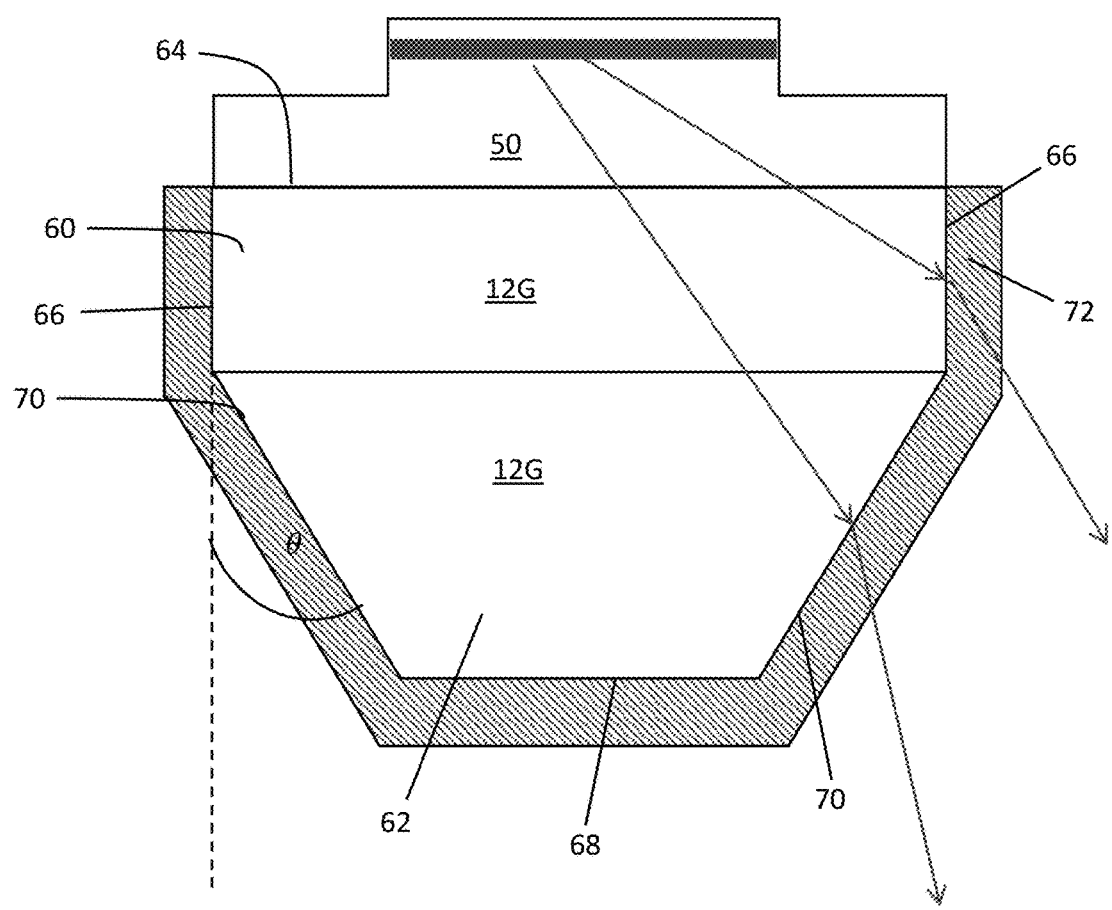

FIG. 5G shows an illustrative substrate 12G according to another embodiment. As shown in FIG. 5G, the substrate 12G can include a top part 60 and a bottom part 62. The top part 60 of the substrate 12G can have a surface 64 on which the light emitting structure 50 is located. The surface 64 can extend horizontally underneath the light emitting structure 50. In one embodiment, the surface 64 of the substrate 12G has a length that is substantially equivalent to the length of the light emitting structure 50. Those skilled in the art will appreciate that substantially equivalent lengths can be obtained by having the size of the substrate 12G be the same as the size of the die of the light emitting structure 50. This allows for cost effective production of devices without sacrificing any of the semiconductor layers (e.g., ultraviolet (UV) LED semiconductor heterostructure layers) that can be used to form the light emitting structure 50.

It is understood, that the length of the surface 64 of the substrate 12G can vary from the length of the light emitting structure 50 if desired. For example, the light emitting structure 50 can take the form of the light emitting structure illustrated in FIG. 5C in which the length of the surface 64 of the substrate 12G would be greater than the length of the light emitting structure 50. In this example, the surface 64 will extend horizontally underneath the light emitting structure 50 beyond its borders with the substrate 12G.

The top part 60 of the substrate 12G can also include a pair of opposing vertical side surfaces 66 each extending vertically from an opposing end of the surface 64. Each of the opposing vertical side surfaces 66 can be substantially perpendicular to one of the opposing ends of the surface 64.

The bottom part 62 of the substrate 12G can include a surface 68 that is parallel with the surface 64 of the top part 60 of the substrate. In one embodiment, the surface 68 can have a length that is less than the length of the surface 64. The bottom part 62 of the substrate 12G can further include pair of opposing oblique sides 70 each extending obliquely inward from one of the vertical side surfaces 66 of the top part 60 of the substrate 12G. In particular, each opposing oblique side 70 can extend obliquely inward to an opposing end of the surface 68.

As shown in FIG. 5G, the oblique sides 70 of the bottom part 62 of the substrate 12G can form an angle $\Theta$ with the negative of the normal of the top surface of the substrate 12G on which the light emitting structure 50 is located (i.e., the surface 64). In one embodiment, the angle $\Theta$ can range from approximately 10 degrees to approximately 80 degrees. More specifically, the angle $\Theta$ can range from approximately 30 degrees to approximately 60 degrees.

FIG. 5G also shows that the substrate 12G can include an encapsulant 72. In one embodiment, the encapsulant can encapsulate all or substantially all exposed surfaces of the substrate 12G. For example, as shown in FIG. 5G, the encapsulant can encapsulate the vertical side surfaces 66 extending vertically from opposing ends of the surface 64, the pair of opposing oblique sides 70 extending obliquely inward from the vertical side surfaces 66, and the surface 68 of the bottom part 62 of the substrate 12G that is parallel with the surface 64 of the top part 60 of the substrate 12G. The encapsulant 72 can have a thickness that is less than or equal to 100 um. In addition, the encapsulant 72 can have a refraction index that is between a refraction index of the substrate 12G and a refraction index of the ambient environment (e.g., air) for light having a wavelength corresponding to a wavelength of light emitted by the light emitting structure 50. It is understood that coverage of the encapsulant 72 with respect to the substrate 12G and the light emitting structure 50 as depicted in FIG. 5G is illustrative of one example, and that is readily apparent that other possibilities exist. For example, in one embodiment, the encapsulant 72 can encapsulate all of the substrate 12G and the light emitting structure 50.

In one embodiment, the encapsulant 72 can comprise a UV transparent fluoropolymer. As used herein, a layer/material is considered "UV transparent" if it allows at least approximately ten percent of electromagnetic radiation in a corresponding UV range of radiation wavelengths to pass therethrough. Below is a listing of illustrative UV transparent fluoropolymers that can be used as the encapsulant 72. Some of these fluoropolymers are transparent to at least a portion of radiation in the wavelength range of 200-380 nanometers, while others are highly transparent (e.g., have a transmission of at least eighty percent for a thin film (e.g., 200 microns or less)) for at least a portion of ultraviolet radiation. It is understood that the following listing is not inclusive and other fluoropolymers, including silicon-based polymers, quartz, cellophane, and/or the like, can be utilized as an encapsulant.

Polytetrafluoroethylene (PTFE) is a polymer including recurring tetrafluoroethylene monomer units whose formula is $[CF_2-CF_2]_n$. PTFE does not melt to form a liquid and cannot be melt extruded. On heating the virgin resin, it forms a clear, coalescent gel at 626° F.±18° (330° C.±15°). Once processed, the gel point (often referred to as the melting point) is 18° F. (10° C.) lower than that of the virgin resin. PTFE is generally sold as a granular powder, a fine powder, or an aqueous dispersion. Each is processed in a different manner.

Fluorinated ethylene propylene (FEP) resin is a copolymer of tetrafluoroethylene and hexafluoropropylene with the formula $[(CF(CF_3)—CF_2)x(CF_2—CF_2)_y]_n$. FEP has a melting point range of 473°-536° F. (245°-280° C.) and is melt processable. FEP is supplied in the form of translucent pellets, powder, or as an aqueous dispersion.

Ethylene chlorotrifluoroethylene (ECTFE) is a copolymer of ethylene and chlorotrifluoroethylene having the formula $[(CH_2—CH_2)_x—(CFCl—CF_2)_y]_n$. ECTFE has a melting point range of 428°-473° F. (220°-245° C.) and is melt processable. ECTFE is available in the form of translucent pellets and as a fine powder.

Polychlorotrifluoroethene (PCTFE) is a polymer of chlorotrifluoroethylene with the formula $[CF_2—CFCl]_n$. PCTFE has a melting point range of 410°-428° F. (210°-220° C.) and is melt processable. PCTFE is available in pellet, granular and powder form.

Perfluoroalkoxy alkanes (PFA) resins are copolymers of TFE fluorocarbon monomers containing perfluoroalkoxy side chains. PFA melts at 536° F. (280° C.) minimum and is melt processable. PFA is available in the form of pellets, powder, and as an aqueous dispersion.

Polyvinylidene difluoride (PVDF) is a homopolymer of vinylidene fluoride having the formula $[CH_2—CF_2]_n$ or a copolymer of vinylidene fluoride and hexafluoropropylene having the formula $[CF(CF_3)—CF_2)_x(CH_2—CF_2)_y]_n$. Copolymers of vinylidene fluoride are also produced with (1) chlorotrifluoroethylene, (2) tetrafluoroethylene, and (3) tetrafluoroethylene and hexafluoropropylene. These are all sold as PVDF copolymers. PVDF polymers/copolymers melt at 194°-352° F. (90°-178° C.), are melt processable, and are supplied in the form of powder, pellets, and dispersions.

Ethylene tetrafluoroethylene (ETFE) is a copolymer of ethylene and tetrafluoroethylene of the formula $[(CF_2—CF_2)_x—(CH_2—CH_2)_y]_n$. ETFE melts at 428° F. (220° C.) minimum. ETFE is melt processable and is supplied in pellet and powder form. A fluorine based plastic, ETFE (ethylene tetrafluoroethylene) offers impressive corrosion resistance and strength over a very wide temperature range. Since ETFE is melt processable, it can be utilized in a vast range of applications.

MFA is a copolymer of tetrafluoroethylene and perfluoromethylvinylether. MFA belongs to the generic class of PFA polymers. MFA melts at 536°-554° F. (280°-290° C.). MFA is available in the form of translucent pellets and aqueous dispersions.

Ethylene tetrafluoroethylene hexafluoropropylene fluoroterpolymer (EFEP) is a copolymer of ethylene, tetrafluoroethylene, and hexafluoropropylene with the formula $[CH_2—CH_2)x(CF_2—CF_2)_y(CF(CF_3)—CF_2)_z]_n$. EFEP polymers melt at 311°-464° F. (155-240° C.), are melt processable, and are supplied in pellet form.

THV is a copolymer containing tetrafluoroethylene, hexafluoropropylene and vinylidenefluoride. THV is melt-processable with melting points from 240° to 455° F. (115° to 235° C.) depending on grade. THV is available in pellet, agglomerate or aqueous dispersions.

HTE is a copolymer of hexafluoropropylene, tetrafluoroethylene, and ethylene. HTE is melt processable with melting points from 310° to 420° F. (155° to 215° C.) depending on grade, and is available in pellet or agglomerate form.

Some illustrative fluoropolymers are marketed under the brand names Teflon® AF (an amorphous fluoroplastic) offered by E. I. du Pont de Nemours and Company and Cytop® (an amorphous fluoropolymer) offered by Bellex International Corporation, which are currently sold as liquid solutions or gels.

An embodiment utilizes an ultraviolet transparent fluoropolymer, such as one of the fluoropolymers discussed herein, in packaging an optoelectronic device. In a more specific embodiment, the optoelectronic device operates at a peak ultraviolet wavelength (referred to as an ultraviolet (UV) optoelectronic device). Several important factors for materials utilized in packaging an ultraviolet optoelectronic device include: transparency to ultraviolet radiation; stability to exposure to ultraviolet radiation, which can translate into a long operating lifetime for the material and the device without significant changes in optical, mechanical or chemical properties; a capability to protect the device from the environment, which can include mechanical dexterity and chemical inertness; and adhesion to surfaces of the optoelectronic device. In a more specific embodiment, a highly ultraviolet transparent fluoropolymer is utilized in the packaging. Such polymers are available and have a long lifetime when exposed to ultraviolet light.

In one embodiment, the encapsulant can include a UV transparent coating. Such a coating can have an index of refraction intermediate to the index of refraction of sapphire and air. Examples of materials that can be used as a UV transparent coating with the encapsulant 72 can include, but are not limited to, sapphire, fused silica, and AAO. For example, a coating comprising of a porous AAO film can provide improved light extraction. Other materials that can be used as a UV transparent coating with the encapsulant 72 can include $A_2O_3$ amorphous film, or $A_2O_3$ film containing vacancies resulting in overall decrease in the index of refraction.

In another embodiment, the encapsulant 72 can include an antireflection coating of a film, a set of films containing antireflection materials, or a set of alternating layers of films containing antireflection materials. The antireflection materials can be selected from the group consisting of $Al_2O_3$, $SiO_2$, and $Hf_2O_3$, $MgF_2$, $CaF_2$, and/or the like. It is understood that the thicknesses of the film or films of antireflection materials can be chosen to provide the desired antireflective properties.

The device of FIG. 5G can be fabricated according to the following method. First, the aforementioned semiconductor layers used to form the light emitting structure 50 can be epitaxially grown over an uncut substrate. As mentioned above, a suitable substrate can include, but is not limited to, sapphire, AlN, GaN, AlGaN, ZnO, $LiGaO_2$, $LiAlO_2$, ScM-$gAlO_4$, $MgAl_2O_4$, SiC, and Si. The semiconductor layers that form the light emitting structure can be epitaxially grown on the surface of the substrate using any of the aforementioned epitaxial growth processes. In one embodiment, the semiconductor layers can be epitaxially grown over a sapphire substrate using MOCVD.

After epitaxially growing the semiconductor layers, the substrate can be shaped to improve light extraction from the light emitting structure. In one embodiment, the substrate can be shaped by scribing a bottom part of the substrate that does not contain the light emitting structure with a set of angled side surfaces. In one embodiment, the bottom part of the substrate can be scribed with a set of angled side surfaces such that a surface tangent vector to at least a portion of each angled side surface forms an angle between approximately −10 degrees and approximately −30 degrees with a negative of a normal vector of the surface of the substrate. The negative sign in front of the range of degree indicates that a surface area of the bottom part of the substrate is smaller than a surface area of a top part of the substrate. In one embodiment, at least 10 μm to about 200 μm of the substrate adjacent the light emitting structure can forego shaping, and thus, remain unscribed.

Figure 11:
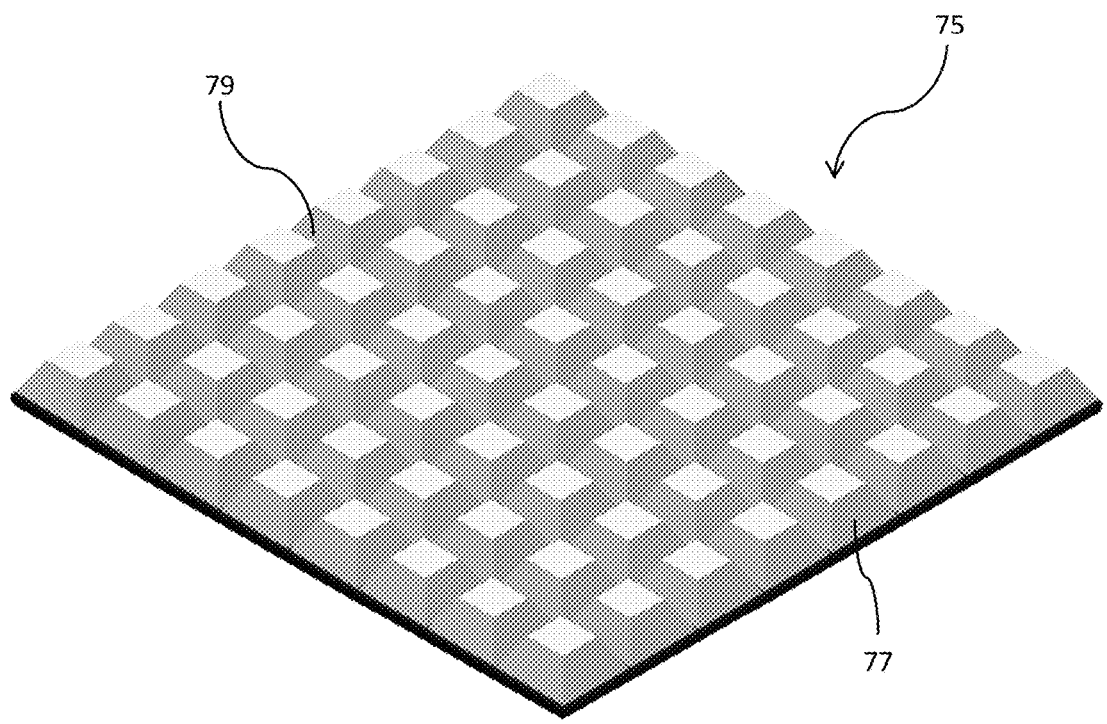
FIG. 11 shows an example of a substrate with multiple grooves that can be used in some of the illustrative substrate configurations of the various embodiments described herein.

In one embodiment, the substrate can be scribed or profiled using a wedge diamond saw. FIG. 11 shows an example of a substrate 75 including a plurality of domains 77 with multiple grooves 79 formed there between. The substrate 75 can be processed by a wedge diamond saw that can be used to scribe the substrate 75. The wedge diamond saw can be used to cut through a fraction of the height of the substrate 75, while a portion of the substrate 75 remains uncut. In this manner, the wedge diamond saw can be used to scribe the substrate 75 with the various side surfaces with the specified angles. It is understood, that other approaches can be used to shape the substrate 75. For example, the laser micromachining system of FIGS. 3A-3B can be used to scribe the substrate 75.

In an alternative embodiment, a substrate can be shaped prior to epitaxial growth of the semiconductor layers of the light emitting structure. For example, the substrate without any semiconductor layers epitaxially grown thereon can be scribed using the wedge diamond saw, the laser micromachining system of FIGS. 3A-3B, or any other suitable system that can cut, shape and/or scribe the substrate in the aforementioned manner. After the substrate has been cut, the semiconductor layers can be epitaxially grown over the portion of the substrate that has not been cut. Regardless of whether the substrate is cut prior to, or after growth of the semiconductor layers, the number of devices that can be fabricated on the wafer will not be affected.

The method of fabricating the device of FIG. 5G can further include roughening or patterning the device to further facilitate light extraction of the device and improve light extraction efficiency. The roughening or patterning can also be used for relaxation of stress buildup between the substrate and any adjacent layer, such as, for example, a buffer layer.

The device can be patterned or roughened using any solution. For example, any of the surfaces of the substrate can be roughened or patterned using lithography and/or etching. Any of the aforementioned lithography and etching techniques are suitable for use to impart a pattern or roughen a surface to facilitate light extraction of the device and improve light extraction efficiency. In one embodiment, a bottom surface 68 (FIG. 5G) of the substrate can be roughened in accordance with any of the roughening approaches previously described. It is understood that any combination of one or more surfaces of the substrate can be roughened, including one or more of the angled side surfaces 70 (FIG. 5G).

The method of fabricating the device of FIG. 5G can further include encapsulating the substrate and the light emitting structure of the device with an encapsulant. The inventors to the various embodiments described herein have found through experimentation and simulation that providing an additional coating to the substrate such as an encapsulant further increases the light extraction from the device. Examples of approaches that can be used to encapsulate the device with an encapsulant include, but are not limited to, fluoropolymers. Any of the aforementioned encapsulant materials can be used to encapsulate the device. In one embodiment, at least one of the surfaces of the substrate can be encapsulated. For example, all of the surfaces of the substrate can be encapsulated. In another embodiment, only the bottom surface of the substrate can be encapsulated. In addition, to the surfaces of the substrate, the light emitting structure can be encapsulated. The thickness of the encapsulant that is applied to the substrate and/or the light emitting structure can be less than or equal to 100 um.

It is understood that this step of applying the encapsulant can occur at a different time in the fabrication of the device rather than after the patterning or roughening, or shaping of the substrate. For example, the encapsulation can occur during the step of making the individual devices after separation of the wafer. In one embodiment, the encapsulation can occur during the application of contact pads to the individual device as the encapsulant can be typically applied in semi-melted state over the surface of the substrate.

The encapsulation can be preceded by polishing the device. Polishing can aid in the adherence of the encapsulant to the device. For example, polishing is helpful with the adherence of an encapsulant to one of the angled side surfaces of the substrate. In one embodiment, polishing the surface of the substrate and the valleys within the substrate to at least 60 nm RMS can be generally sufficient enough to fill any roughness voids in the substrate material that otherwise would hinder the adherence of the encapsulant. Examples of approaches that can be used to polish the device to a sufficiently low roughness that would aid in the adherence of the encapsulant include, but are not limited to, fluoropolymers.

The method of fabricating the device of FIG. 5G can further include cleaning the substrate and the light emitting structure to remove any light absorbing residue that may remain after any of the processing steps such as scribing to further improve light extraction. Any of the aforementioned cleaning approaches or combinations thereof can be used to clean the device including the substrate and the light emitting structure.

In one embodiment, the method of fabricating the device can also include attaching one or more wave guiding structures to the device. For example, optical fibers, can be attached to a surface of the substrate such as its bottom surface. Other steps that can improve light extraction can include forming at least one of the surfaces of the substrate, such as its bottom surface, into a lens. In this manner, forming a lens with a portion of the substrate that has an encapsulant can be used to control an angular light emission pattern for the light emitting structure.

It is understood that the foregoing steps for fabricating the device of FIG. 5G are illustrative of some of the acts or steps that can be performed during the fabrication of the device and are not intended to be limiting. In some alternative implementations, the acts or steps may occur out of the order described herein or, for example, may in fact occur substantially concurrently or in the reverse order, depending upon the act involved. Also, those skilled in the art will recognize that additional acts or steps that describe the fabrication may be added. It is also possible that some of the described acts or steps can be removed from the fabrication process.

Figure 12A:
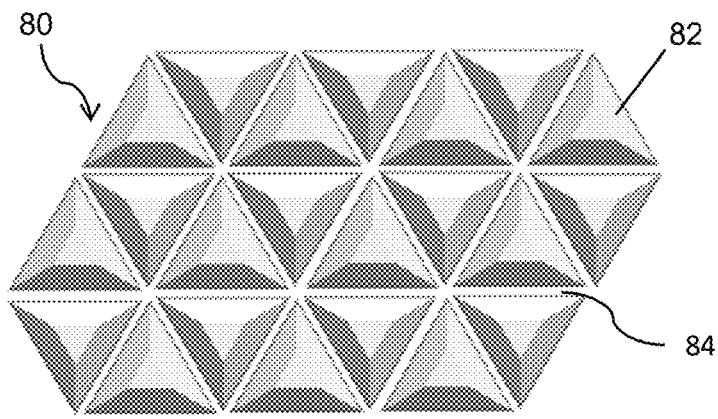
FIGS. 12A-12C show illustrative LED devices in a triangular shape with angled side surfaces according to an embodiment.
Figure 12B:
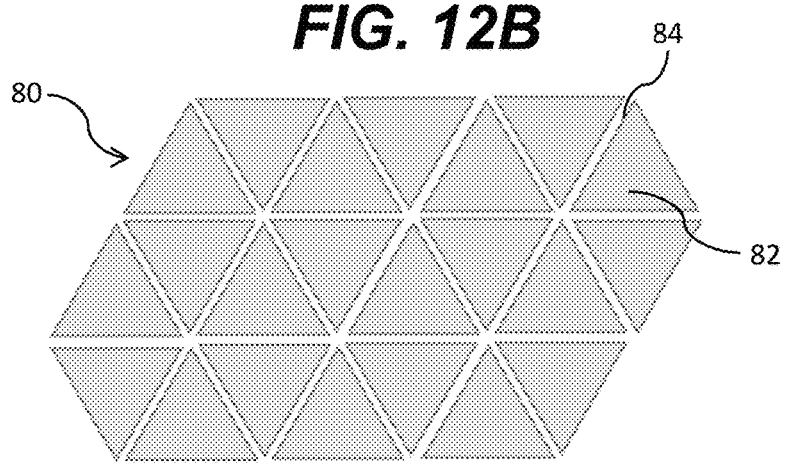
Figure 12C:
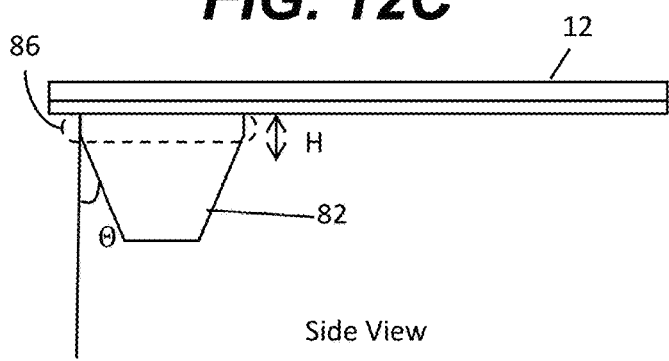

FIGS. 12A-12C show illustrative LED devices 80 in the form of LED chips each having a triangular shape with angled side surfaces 82 according to an embodiment. In particular, FIGS. 12A-12B show bottom views of the LED chips, which can be in one embodiment, UV LED chips, as viewed from the substrate side. FIG. 12A, which is an isometric view, shows that the LED chips can each have a shape of a triangular pyramid resembling a tetrahedron with triangular bottom and top surfaces. As shown in FIGS.

12A-12B, each of the triangular, pyramid-shaped LED chips 80 can be separated by a plurality of grooves 84 formed in the substrate 12. FIG. 12C shows that each sidewall of one of the triangular, pyramid-shaped LED chips 80 can be angled with an angle Θ from a normal of surface of the substrate. In one embodiment, the angle Θ can range from approximately 10 degrees to approximately 30 degrees. FIG. 12C further shows that each sidewall of one of the triangular, pyramid-shaped LED chips 80 can have a region 86 that has no slope and a characteristic thickness H. In one embodiment, the characteristic thickness H of region 86 can range from about 10 microns to about 500 microns.

Figure 6A:
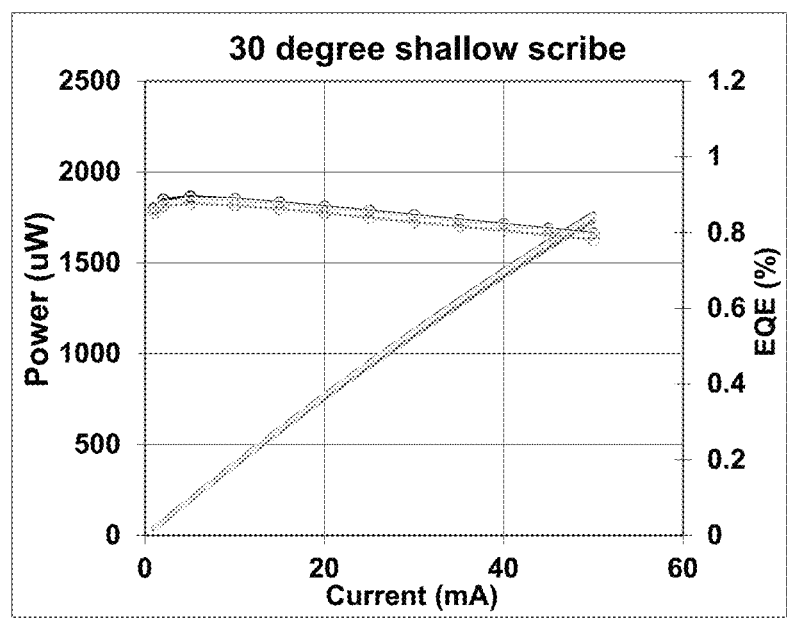
FIGS. 6A-6D show power and external quantum efficiency of light emitting structures for different scribing procedures.
Figure 6B:
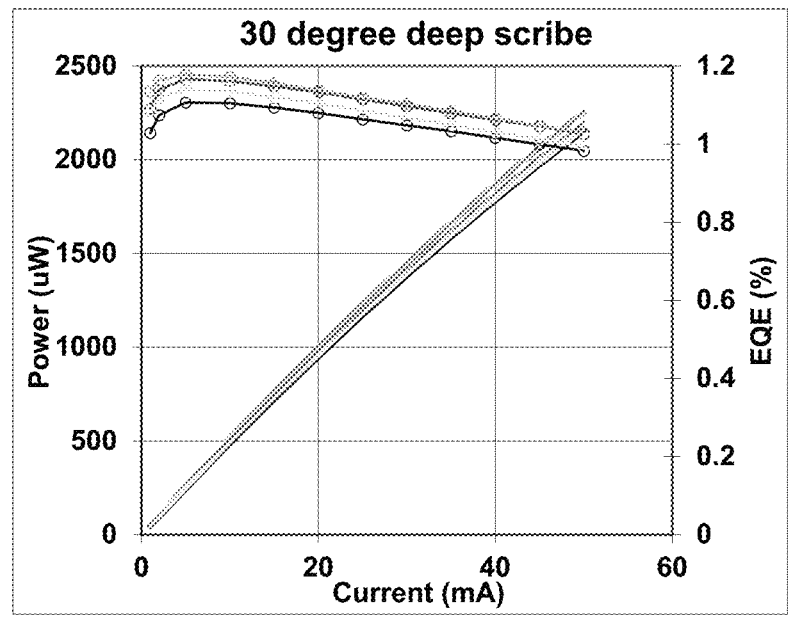
Figure 6C:
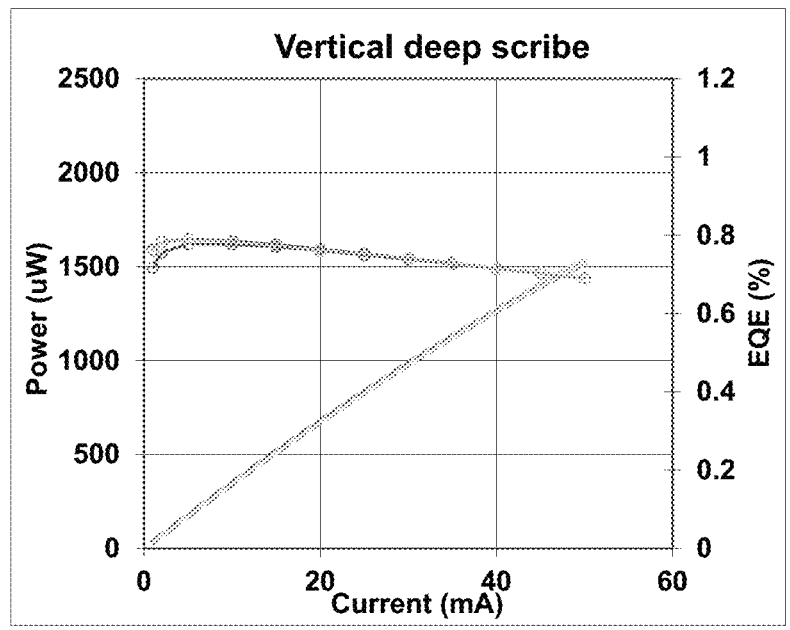
Figure 6D:
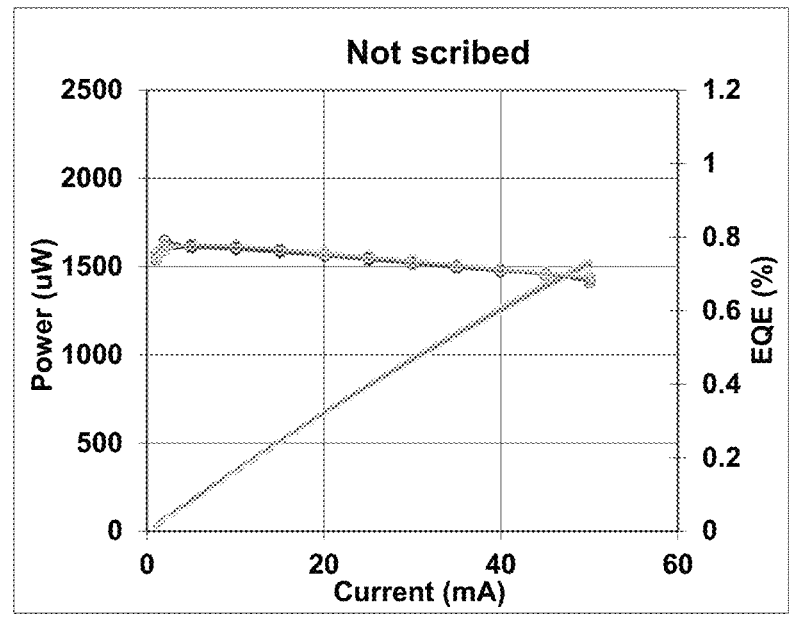

Various devices were fabricated and evaluated for the effects of different scribing procedures. In particular, a wafer containing a large number of LED dies grown on a sapphire substrate was evaluated. Each LED die was a deep ultraviolet LED emitting ultraviolet light having a peak wavelength of approximately 275 nanometers. FIGS. 6A-6D show power (left axis, diagonal line, in micro-watts) and external quantum efficiency (EQE, circle data, right axis) of the light emitting structures for different scribing procedures. In particular, FIG. 6A shows the result of shallow scribing at a thirty degree angle; FIG. 6B shows the result of deep scribing at thirty degree angle; FIG. 6C shows the result of performing a deep vertical scribing (e.g., a zero degree angle); and FIG. 6D shows the result when no scribing is performed. As illustrated, the light extraction efficiency and power increased after both of the angled scribing procedures (e.g., by more than forty percent for some LED devices after the deep scribing at a thirty degree angle). However, the vertical scribing had nearly no effect on the power or light extraction efficiency.

Figure 7A:
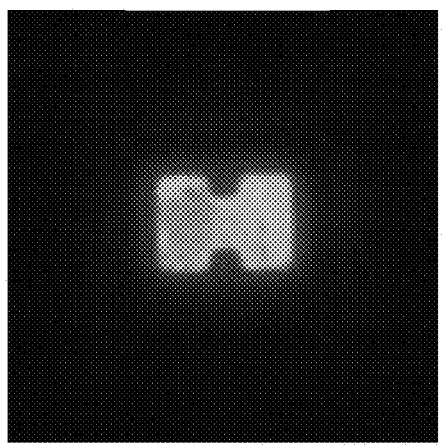
FIGS. 7A-7D show the emission of light from illustrative LED devices evaluated for different scribing procedures.
Figure 7B:
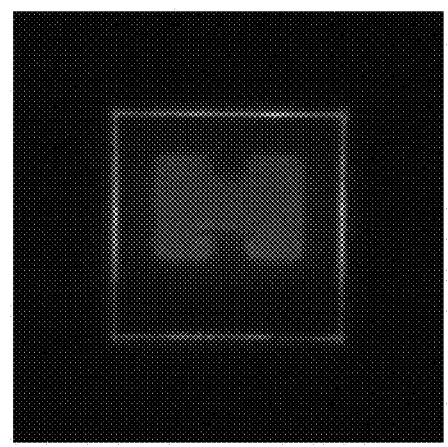
Figure 7C:
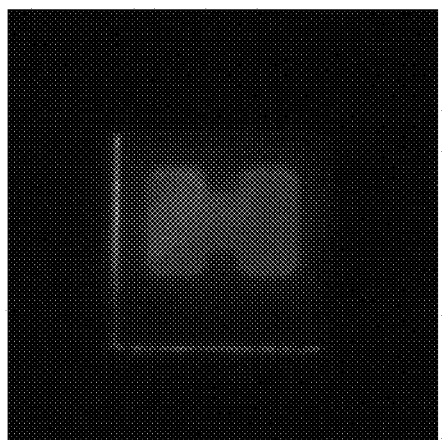
Figure 7D:
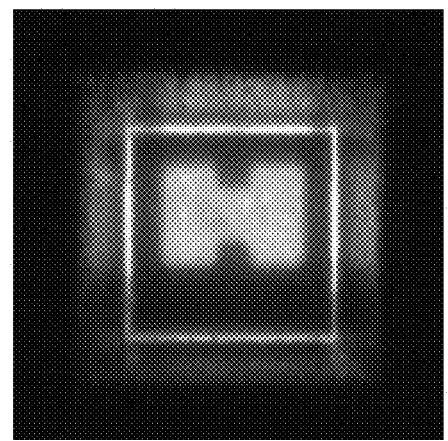

Similarly, FIGS. 7A-7D show the emission of light from illustrative LED devices evaluated for different scribing procedures. In particular, FIG. 7A shows the emission of light from an LED with a substrate having no scribing; FIG. 7B shows the emission of light from an LED with a substrate having a thirty degree shallow scribing; FIG. 7C shows the emission of light from an LED with a substrate having a vertical deep scribing; and FIG. 7D shows the emission of light from an LED with a substrate having a thirty degree deep scribing. As illustrated, the light emission from the LED with the substrate having a thirty degree deep scribing is substantially increased from each of the other scribing procedures.

Figure 8:
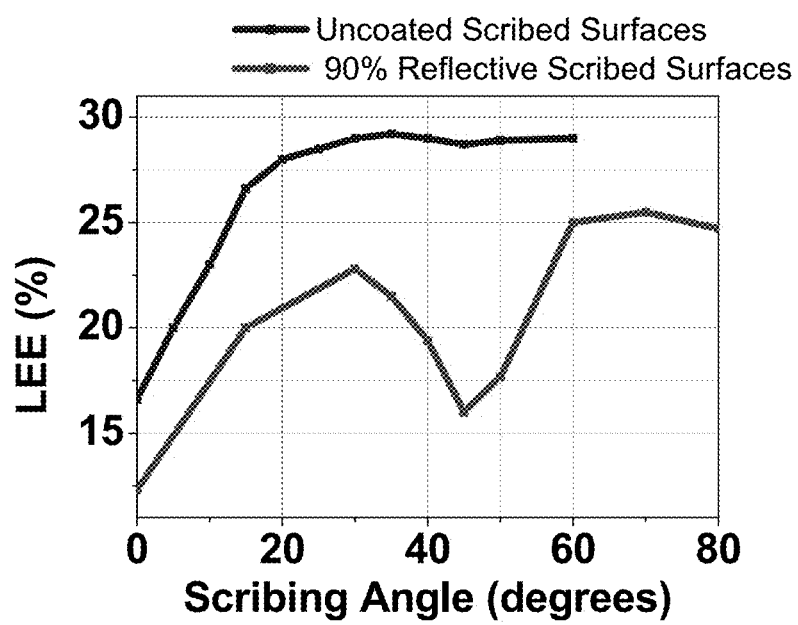
FIG. 8 shows light extraction efficiencies obtained through ray tracing simulations of a deep ultraviolet LED device for scribed surfaces of varying angles with and without reflective coating.

FIG. 8 shows light extraction efficiencies obtained through ray tracing simulations of a deep ultraviolet LED device for scribed surfaces of varying angles with and without reflective coating. As illustrated, for uncoated scribed surfaces, the preferred angle of substrate scribing is approximately thirty degrees. However, when the scribed surfaces are coated with a reflective coating, the angle of substrate scribing has a first peak at approximately thirty degrees and a second peak at approximately sixty degrees.

Figure 9A:
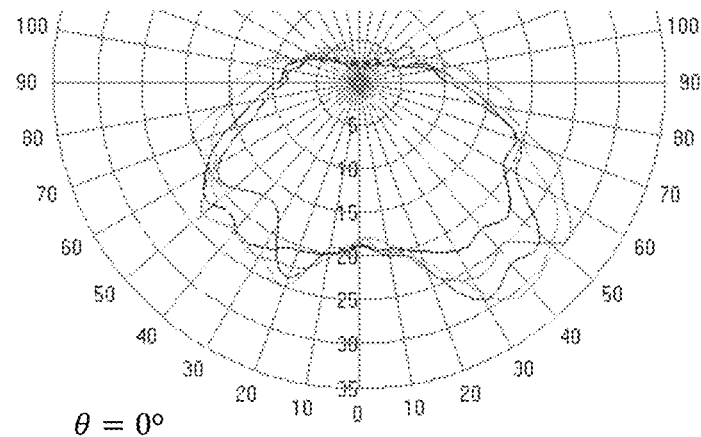
FIGS. 9A-9H show polar distributions of illustrative LED devices with substrates having angled sides of various illustrative angles according to embodiments.
Figure 9B:
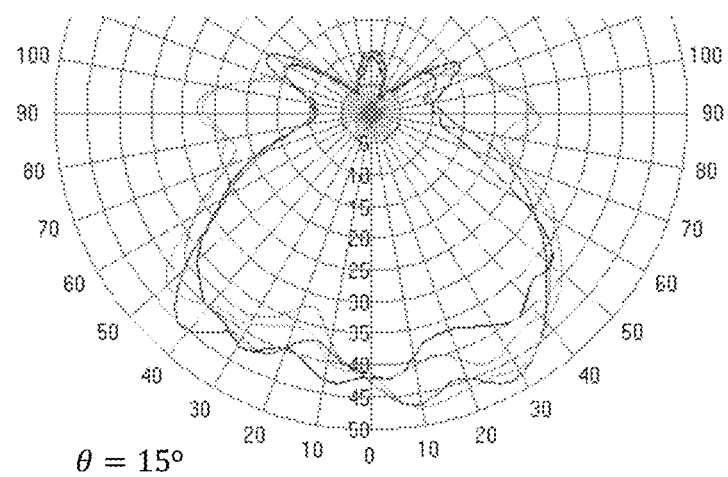
Figure 9C:
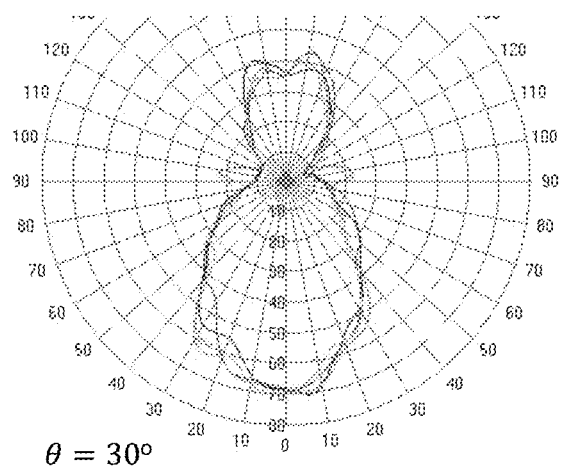
Figure 9D:
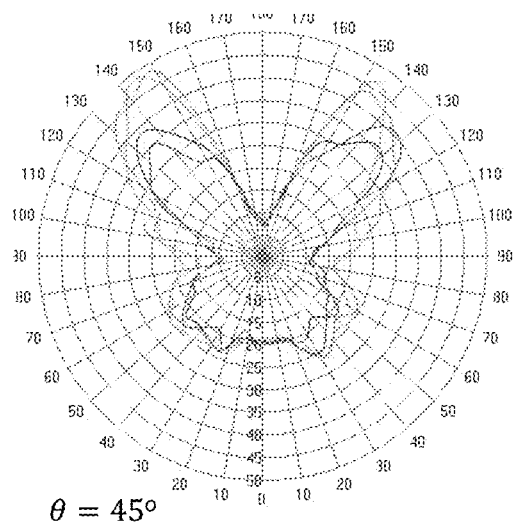
Figure 9E:
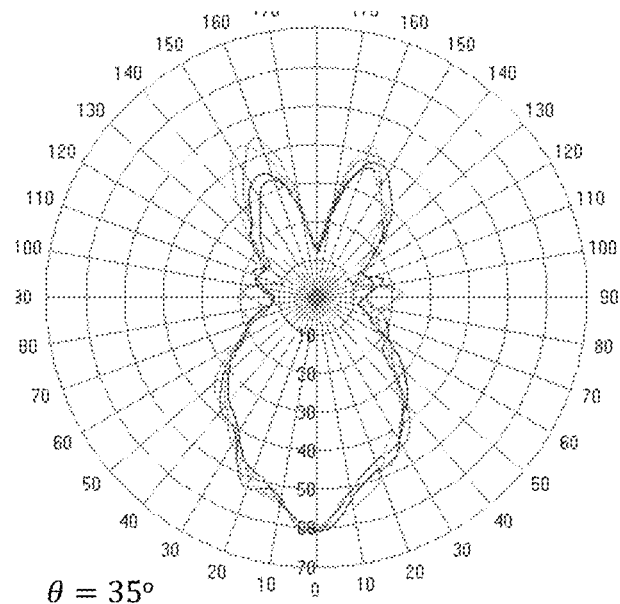
Figure 9F:
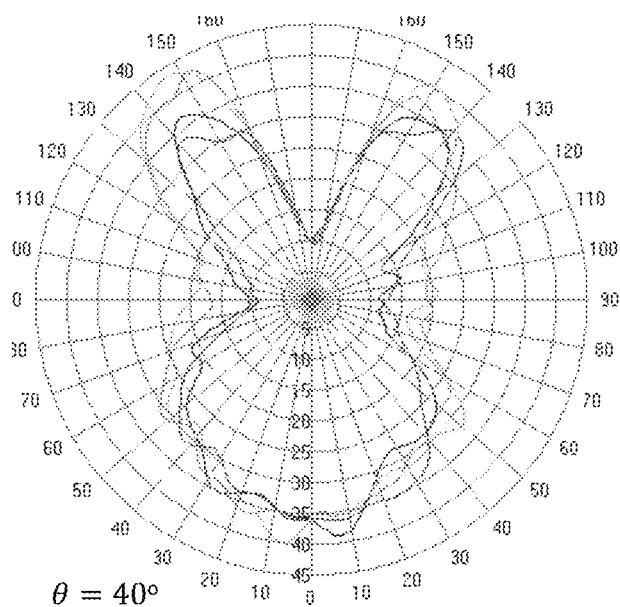
Figure 9G:
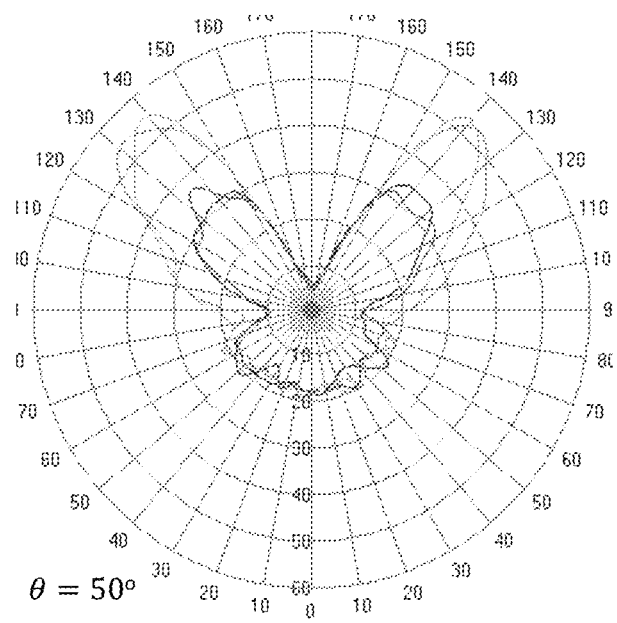
Figure 9H:
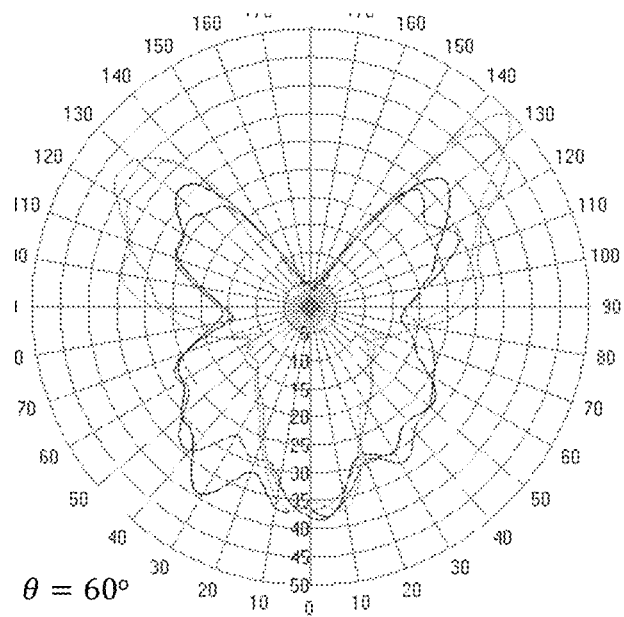
Figure 10A:
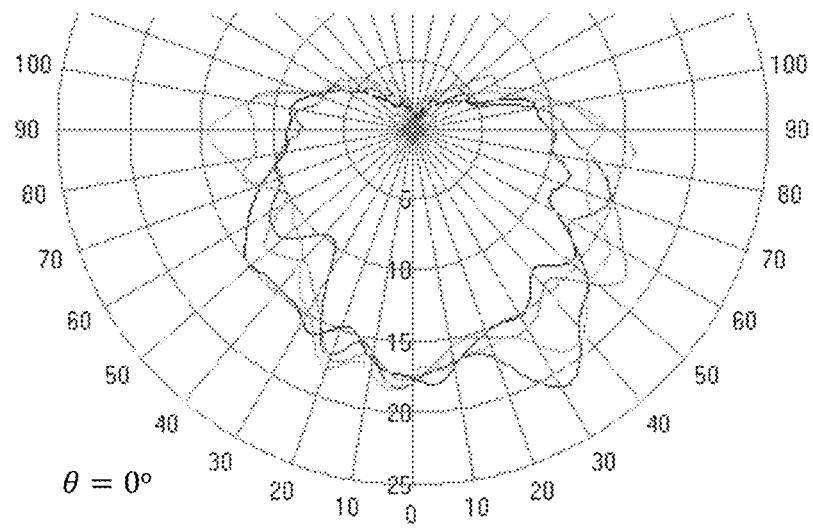
FIGS. 10A-10D show polar distributions of illustrative LED devices with substrates having angled sides of various illustrative angles covered with a reflective coating according to embodiments.
Figure 10B:
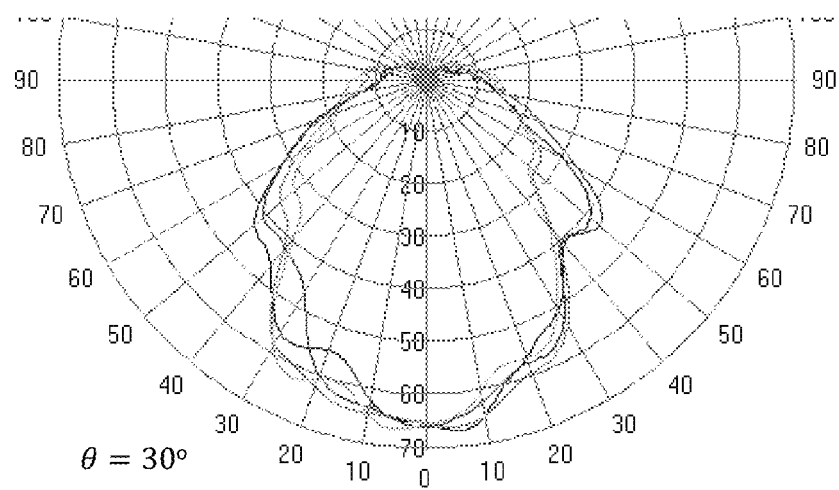
Figure 10C:
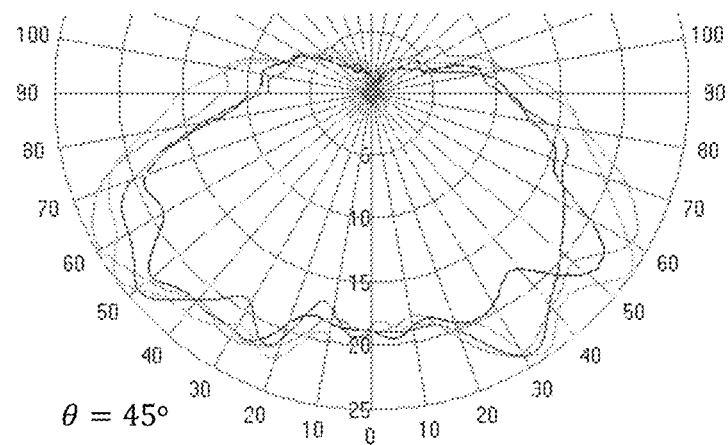
Figure 10D:
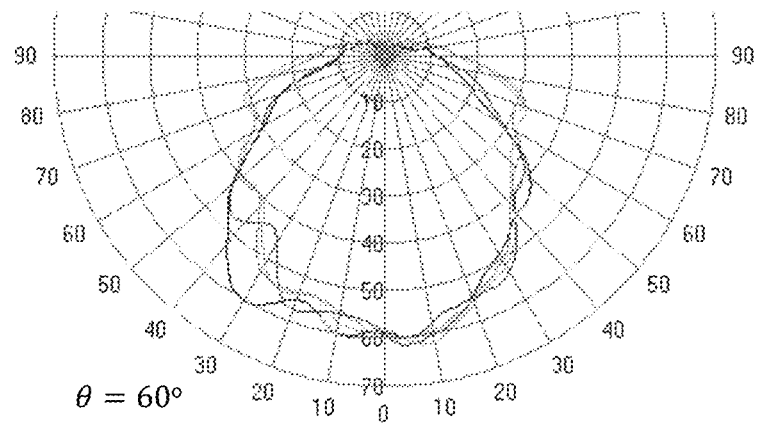

FIGS. 9A-9H show polar distributions of illustrative LED devices with substrates having angled sides of various illustrative angles according to embodiments. FIG. 9A shows the polar distribution for a vertical side. As illustrated, the polar distribution of the radiated light becomes more widespread and is significantly increased for the devices with the angled sides. FIGS. 10A-10D show polar distributions of illustrative LED devices with substrates having angled sides of various illustrative angles covered with a reflective coating according to embodiments. The reflective coating is approximately ninety percent reflective of the light emitted by the LED. As illustrated in FIG. 10B (angled sides of thirty degrees) and 10D (angled sides of sixty degrees), the corresponding LEDs have a relatively focused emission with an overall high extraction efficiency.

While various aspects of the invention have been shown and described with respect to a light emitting structure, such as an LED, it is understood that the teachings of the invention can be applied to various types of devices, which can be formed from one or more light emitting structures. For example, an embodiment of a device can include two or more devices monolithically integrated on the same substrate (e.g., formed within the same region as shown in FIG. 2). To this extent, the two devices can include two or more light emitting structures. In this case, the light emitting structures can form an LED lamp, or the like. The light emitting structures can form arrays where each light emitting structure and its corresponding underlying substrate is scribed at a set of angles specific to the light emitting structure. The set of angles can be selected for each light emitting structure to, for example, control an emitting pattern of the overall device (e.g., the LED lamp).

Furthermore, a device can include one or more other types of devices for which operation of the device is affected by light. For example, an embodiment can include a photodetector and/or a light emitting structure capable of being biased to operate as a photodetector, which is monolithically integrated on the same substrate. Furthermore, a device described herein can be configured to operate as a sensing device. For example, a set of channels and/or cavities can be formed in the substrate, within which a medium can be placed. The medium can comprise any type of medium, including a solid, a polymer, a liquid, a gas, and/or the like. The sensing can be performed based on, for example, a presence of a material that is altered by and/or alters the corresponding light emitted by the light emitting structure. To this extent, the formation of such a device can include monolithically integrating one or more photodetectors on the substrate, which can be configured to detect changes to the light and/or material.

Figure 13:
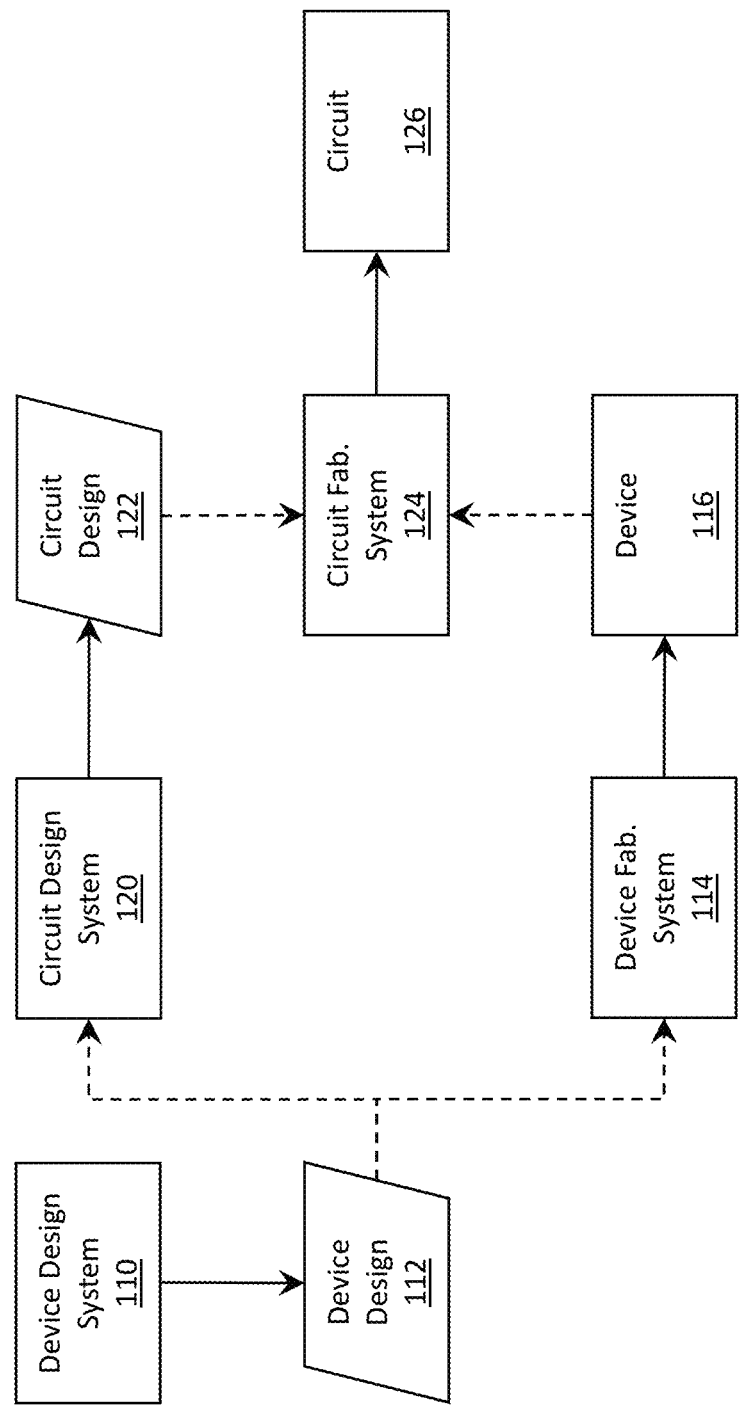
FIG. 13 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 13 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A light emitting device, comprising:
   a light emitting structure; and
   a substrate having a first surface with the light emitting structure located thereon and a second surface parallel with the first surface, the second surface having a length that is less than a length of the first surface, the first surface extending horizontally underneath the light emitting structure beyond any borders of the light emitting structure with the substrate, a pair of opposing vertical side surfaces each extending vertically from an opposing end of the first surface, each of the opposing vertical side surfaces being perpendicular to one of the opposing ends of the first surface, and a pair of opposing oblique sides each extending obliquely inward from one of the vertical side surfaces, each opposing oblique side extending obliquely inward to an opposing end of the second surface,
   wherein the second surface of the substrate is roughened to improve an extraction of light through the second surface, wherein the roughened second surface includes a first roughening of a first scale and a second roughening of a second scale on the first roughening, wherein the first scale is an order of magnitude larger than a peak emission wavelength of light emitted by the light emitting structure and the second scale is on the order of the peak emission wavelength of the light emitted by the light emitting structure.

2. The light emitting device of claim 1, wherein the length of the second surface is substantially equivalent to a length of the light emitting structure.

3. The light emitting device of claim 1, wherein each of the opposing oblique sides of the substrate form an angle Θ with a negative of a normal of the first surface of the substrate.

4. The light emitting device of claim 3, wherein the angle Θ ranges from approximately 10 degrees to approximately 80 degrees.

5. The light emitting device of claim 1, wherein the second surface of the substrate is encapsulated by an encapsulant forming a lens.

6. The light emitting device of claim 1, further comprising an optical fiber physically attached to the second surface, wherein the optical fiber wave guides at least some of the light emitted by the light emitting structure.

7. The light emitting device of claim 1, wherein the roughened second surface includes a roughness that is different along different regions of the second surface of the substrate.

8. The light emitting device of claim 1, further comprising an encapsulant that encapsulates the substrate and the light emitting structure, wherein the encapsulant has a refraction index between a refraction index of the substrate and a refraction index of air for light having a wavelength corresponding to a wavelength of light emitted by the light emitting structure.

9. The light emitting device of claim 1, wherein the substrate is sapphire.

10. A method of fabricating a device, comprising:
    forming a device structure including a light emitting structure located on a first surface of a substrate, wherein the substrate includes a second surface parallel with the first surface, the second surface having a length that is less than a length of the first surface, the first surface extending horizontally underneath the light emitting structure beyond any borders of the light emitting structure with the substrate;
    forming a pair of opposing vertical side surfaces of the substrate, each extending vertically from an opposing end of the first surface, each of the opposing vertical side surfaces being perpendicular to one of the opposing ends of the first surface;

forming a pair of opposing oblique sides of the substrate, each extending obliquely inward from one of the vertical side surfaces, each opposing oblique side extending obliquely inward to an opposing end of the second surface; and roughening the second surface of the substrate to improve an extraction of light through the second surface, wherein the roughened second surface includes a first roughening of a first scale and a second roughening of a second scale on the first roughening, wherein the first scale is an order of magnitude larger than a peak emission wavelength of light emitted by the light emitting structure and the second scale is on the order of the peak emission wavelength of the light emitted by the light emitting structure.

11. The method of claim 10, wherein each of the opposing oblique sides of the substrate form an angle Θ with a negative of a normal of the first surface of the substrate, wherein the angle Θ ranges from approximately 10 degrees to approximately 80 degrees.

12. The method of claim 10, further comprising encapsulating the second surface of the substrate with an encapsulant forming a lens, wherein the encapsulant has a refraction index between a refraction index of the substrate and a refraction index of air for light having a wavelength corresponding to a wavelength of light emitted by the light emitting structure.

13. The method of claim 10, wherein the forming the device structure includes epitaxially growing the light emitting structure on the substrate.

14. The method of claim 10, further comprising cleaning the substrate and the light emitting structure.

15. The method of claim 10, further comprising attaching a wave guiding structure to the second surface of the substrate.

16. An ultraviolet light emitting device, comprising:
an ultraviolet light emitting structure; and
a sapphire substrate having a first surface with the ultraviolet light emitting structure located thereon and a second surface parallel with the first surface, the second surface having a length that is less than a length of the first surface, the first surface extending horizontally underneath the ultraviolet light emitting structure beyond any borders of the ultraviolet light emitting structure with the substrate, a pair of opposing vertical side surfaces each extending vertically from an opposing end of the first surface, each of the opposing vertical side surfaces being perpendicular to one of the opposing ends of the first surface, and a pair of opposing oblique sides each extending obliquely inward from one of the vertical side surfaces, each opposing oblique side extending obliquely inward to an opposing end of the second surface, wherein the second surface of the substrate is roughened to improve an extraction of light from the substrate, wherein the roughened second surface includes a first roughening of a first scale and a second roughening of a second scale on the first roughening, wherein the first scale is an order of magnitude larger than a peak emission wavelength of light emitted by the ultraviolet light emitting structure and the second scale is on the order of the peak emission wavelength of the light emitted by the ultraviolet light emitting structure.

17. The light emitting device of claim 16, wherein each of the opposing oblique sides of the substrate form an angle Θ with a negative of a normal of the first surface of the substrate.

18. The light emitting device of claim 17, wherein the angle Θ ranges from approximately 10 degrees to approximately 80 degrees.

19. The light emitting device of claim 16, wherein the second surface of the substrate is encapsulated by an encapsulant forming a lens.

20. The light emitting device of claim 19, wherein the encapsulant has a refraction index between a refraction index of the substrate and a refraction index of air for light having a wavelength corresponding to a wavelength of light emitted by the light emitting structure.

* * * * *